(12) United States Patent
Park et al.

(10) Patent No.: US 8,404,548 B2
(45) Date of Patent: Mar. 26, 2013

(54) METHOD OF MANUFACTURING NONVOLATILE MEMORY DEVICE AND NONVOLATILE MEMORY DEVICE MANUFACTURED BY THE METHOD

(75) Inventors: Imsoo Park, Seongnam-si (KR);
Young-Hoo Kim, Seongnam-si (KR);
Changki Hong, Seongnam-si (KR);
Jaedong Lee, Seongnam-si (KR);
Daehong Eom, Hwaseong-si (KR);
Sung-Jun Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/179,842

(22) Filed: Jul. 11, 2011

(65) Prior Publication Data

US 2011/0266606 A1    Nov. 3, 2011

Related U.S. Application Data

(63) Continuation of application No. 12/590,614, filed on Nov. 10, 2009, now Pat. No. 7,994,011.

(30) Foreign Application Priority Data

Nov. 12, 2008 (KR) .................. 10-2008-0112240
Dec. 19, 2008 (KR) .................. 10-2008-0130438

(51) Int. Cl.
*H01L 21/336* (2006.01)
(52) U.S. Cl. ........................ 438/287; 438/288
(58) Field of Classification Search .......... 438/197–308; 257/288–413
See application file for complete search history.

(56) References Cited

U.S. PATENT DOCUMENTS 5,155,657 A   10/1992   Oehrlein et al.
5,160,987 A   11/1992   Pricer et al.
(Continued)

FOREIGN PATENT DOCUMENTS

JP    10-93083       4/1998
JP    2007-317874    12/2007
(Continued)

OTHER PUBLICATIONS

"Method of Manufacturing Nonvolatile Memory Device and Nonvolatile Memory Device Manufactured by the Method" Specification, Drawings and Prosecution History, of U.S. Appl. No. 12/590,614, filed Nov. 10, 2009, by Imsoo Park,et al., which is stored in the U.S. Patent and Trademark Office (USPTO) Image File Wrapper (IFW) System.

*Primary Examiner* — Fernando L Toledo
*Assistant Examiner* — Karen Kusumakar
(74) *Attorney, Agent, or Firm* — Onello & Mello, LLP

(57) ABSTRACT

A method of manufacturing a nonvolatile memory device having a three-dimensional memory device includes alternately stacking a plurality of first and second material layers having a different etching selectivity on a semiconductor substrate; forming an opening penetrating the plurality of first and second material layers; removing the first material layers exposed by the opening to form extended portions extending in a direction perpendicular to the semiconductor substrate from the opening; conformally forming a charge storage layer along a surface of the opening and the extended portions; and removing the charge storage layer formed on sidewalls of the second material layers to locally form the charge storage layer patterns in the extended portions.

4 Claims, 27 Drawing Sheets

U.S. PATENT DOCUMENTS

| | | | |
|---|---|---|---|
| 5,753,948 A | 5/1998 | Nguyen et al. | |
| 6,127,220 A * | 10/2000 | Lange et al. | 438/254 |
| 7,382,018 B2 | 6/2008 | Kim et al. | |
| 7,514,320 B2 * | 4/2009 | Uchiyama | 438/253 |
| 2006/0186446 A1 * | 8/2006 | Kim et al. | 257/296 |
| 2008/0067583 A1 | 3/2008 | Kidoh et al. | |
| 2008/0173928 A1 * | 7/2008 | Arai et al. | 257/316 |
| 2008/0179659 A1 * | 7/2008 | Enda et al. | 257/326 |
| 2008/0242025 A1 | 10/2008 | Kim et al. | |
| 2009/0001419 A1 * | 1/2009 | Han et al. | 257/190 |
| 2009/0184360 A1 * | 7/2009 | Jin et al. | 257/319 |

FOREIGN PATENT DOCUMENTS

| | | |
|---|---|---|
| JP | 2008-72051 | 3/2008 |
| JP | 2008-171838 | 7/2008 |
| KR | 10-0674952 | 8/2006 |
| KR | 10-855990 | 8/2008 |

* cited by examiner

METHOD OF MANUFACTURING NONVOLATILE MEMORY DEVICE AND NONVOLATILE MEMORY DEVICE MANUFACTURED BY THE METHOD

CROSS-REFERENCE TO RELATED APPLICATIONS

This U.S. non-provisional patent application claims is a continuation application of U.S. application Ser. No. 12/590,614, filed on Nov. 10, 2009, which claims priority under 35 U.S.C. §119 of Korean Patent Application No. 10-2008-00112240, filed in the Korean Intellectual Property Office on Nov. 12, 2008 and Korean Patent Application No. 10-2008-0130438, filed in the Korean Intellectual Property Office on Dec. 19, 2008, the entire contents of which are herein incorporated by reference.

BACKGROUND

The exemplary embodiments disclosed herein relate to methods of manufacturing nonvolatile memory devices, and more particularly, to methods of manufacturing nonvolatile memory devices having a three-dimensional structure capable of improving reliability, and nonvolatile memory devices manufactured by the methods.

Generally, nonvolatile memory devices can electrically erase and program data and can retain their stored data even when their power supplies are interrupted. The use of nonvolatile memory devices has increased dramatically in various fields.

Nonvolatile memory devices include various types of memory cell structures and are classified as NAND type memory devices and NOR type memory devices, depending on the memory cell array structure of the device. NAND type memory devices and NOR type memory devices have the advantages of high integration and high speed, respectively.

In particular, since a NAND type nonvolatile memory device has a cell string structure connecting a plurality of memory cell transistors in series, it is advantageous in high integration. Also, since a NAND type nonvolatile memory device adopts an operation method of changing data stored in a plurality of memory cell transistors at the same time, a speed of updating data is much faster than that of a NOR type nonvolatile memory device. Because of high integration and a high data update speed, a NAND type nonvolatile memory device is mainly used in portable electronic devices which need mass storage devices, such as digital cameras, MP3 players or the like. Studies have been performed so as to expedite and raise the advantages of a NAND type nonvolatile memory device. A NAND type nonvolatile memory device having a three-dimensional structure is being developed.

Nonvolatile memory devices can be classified as floating gate type nonvolatile memory devices or charge trap nonvolatile memory devices, depending on the type of a memory storage layer constituting a unit cell. Since the charge trap nonvolatile memory devices can realize a low power supply, a low voltage and high integration, development of the charge trap nonvolatile memory devices increases.

SUMMARY

According to one aspect, the present invention provides a method of manufacturing a nonvolatile memory device. The method may include alternately stacking a plurality of first and second material layers having a different etching selectivity on a semiconductor substrate; forming an opening penetrating the plurality of first and second material layers; removing the first material layers exposed by the opening to form extended portions extending in a direction perpendicular to the semiconductor substrate from the opening; conformally forming a charge storage layer along a surface of the opening and the extended portions; and removing the charge storage layer formed on sidewalls of the second material layers to locally form the charge storage layer patterns in the extended portions.

In one embodiment, forming the opening includes forming a hole or a trench penetrating the first and second material layers.

In one embodiment, forming the charge storage layer patterns comprises: filling the opening and the extended portions on which the charge storage layer is formed with a sacrificial layer; forming a mask pattern on the uppermost of the second material layers; removing the sacrificial layer and the charge storage layer in the opening using the mask pattern as an etching mask; and removing the sacrificial layer filling the extended portions to form the charge storage layer patterns.

In one embodiment, the extended portions are formed by removing a portion of the first material layers, and the charge storage layer patterns are in contact with a sidewall of the first material layer. In one embodiment, the first material layers are formed of a conductive layer. In one embodiment, the charge storage layer patterns comprise a charge blocking layer, a charge trapping layer and a charge tunneling layer and wherein the charge blocking layer is in contact with the sidewall of the first material layer.

In one embodiment, the method further comprises, after forming the charge storage layer patterns, forming a semiconductor pillar by filling the opening and the extended portions with a semiconductor material.

In one embodiment, the method further comprises, before forming the openings, forming semiconductor patterns penetrating the first and second material layers, wherein the openings are formed between a pair of the semiconductor patterns. In one embodiment, the extended portions are formed by removing all the first material layers, and the charge storage layer patterns are in contact with sidewalls of the semiconductor patterns.

In one embodiment, the method further comprises, after forming the charge storage layer patterns, forming a conductive pattern in each of the extended portions on which the charge storage layer is formed.

According to another aspect, the present invention provides a nonvolatile memory device. The device may include conductive layers that are stacked on a semiconductor substrate, an insulating layer being disposed between the conductive layers; active pillars comprising a body portion penetrating the conductive layers to be connected to the semiconductor substrate and a plurality of protrusions protruded toward sidewalls of the conductive layers from the body portion; and charge storage layer patterns formed between the sidewalls of the conductive layers and the protrusions of the active pillars.

In one embodiment, the protrusions are formed between vertically adjacent insulating layers and the charge storage layer patterns extend between the protrusions and the insulating layers.

According to another aspect, the present invention provides a nonvolatile memory device. The device may include conductive patterns three-dimensionally arranged on a semiconductor substrate; semiconductor patterns extending from the semiconductor substrate to pass between the conductive patterns; and a charge storage layer pattern disposed between the semiconductor pattern and the conductive pattern, wherein the charge storage layer pattern is separated from the charge storage layer pattern in contact with the different conductive pattern.

In one embodiment, the charge storage layer patter extends in a top surface and a bottom surface of the conductive pattern.

BRIEF DESCRIPTION OF THE FIGURES

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE EMBODIMENTS

Figure 1:
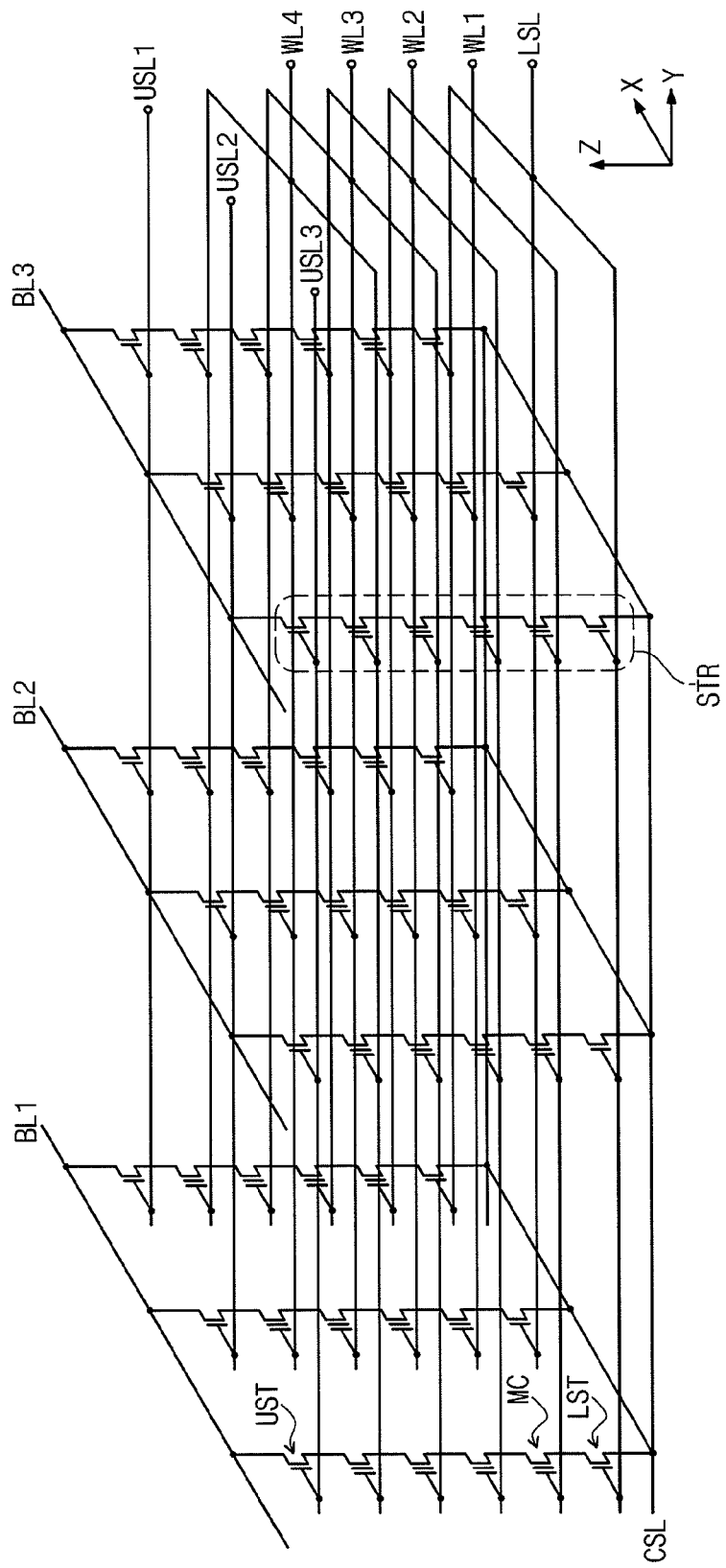
FIG. 1 is a schematic circuit diagram of a nonvolatile memory device according to embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this description will be thorough and complete, and will fully convey the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

Hereinafter, referring to drawings, embodiments of the present invention are described in detail. A nonvolatile memory device according to embodiments of the present invention has a three-dimensional structure.

FIG. 1 is a schematic circuit diagram of a nonvolatile memory device according to embodiments of the present invention.

Referring to FIG. 1, a nonvolatile memory device according to an embodiment of the present invention includes a cell array having a plurality of strings (STR). The cell array includes bit lines (BL1~BL3), word lines (WL1~WL4), upper and lower select lines (USL1~USL3, LSL) and a common source line (CSL). The cell array also includes a plurality of strings (STR) between the bit lines (BL1~BL3) and the common source line (CSL).

Each string (STR) includes a plurality of memory cells (MC) serially connected to each other between an upper transistor (UST) and a lower transistor (LST). Drains of the upper select transistors (UST) are connected to the bit lines (BL1~BL3) and sources of the lower select transistors (LST) are connected to the common source line (CSL). The common source line (CSL) is a line to which the sources of the lower select transistors (LST) are commonly connected.

The upper select transistors (UST) are connected to the upper select lines (USL1~USL3) and the lower select transistors (LST) are connected to the lower select line (LSL). The memory cells (MC) are connected to the word lines (WL1~WL4).

The cell array is arranged in a three-dimensional structure and the strings (STR) have a structure in which the memory cells (MC) are serially connected to each other in a z axis direction perpendicular to an xy plane parallel to a top surface of a substrate. Thus, channels of the select transistors (UST, LST) and the memory cell transistors (MC) may be formed to be perpendicular to an xy plane.

In a nonvolatile memory device having a three-dimensional structure, each xy plane includes m memory cells and the xy plane including m memory cells may be stacked to have n layers (here, m and n are natural number).

Hereinafter, referring to FIGS. 2 through 9, a nonvolatile memory device according to an embodiment of the present invention and a method of manufacturing the same are described in detail.

Figure 2:
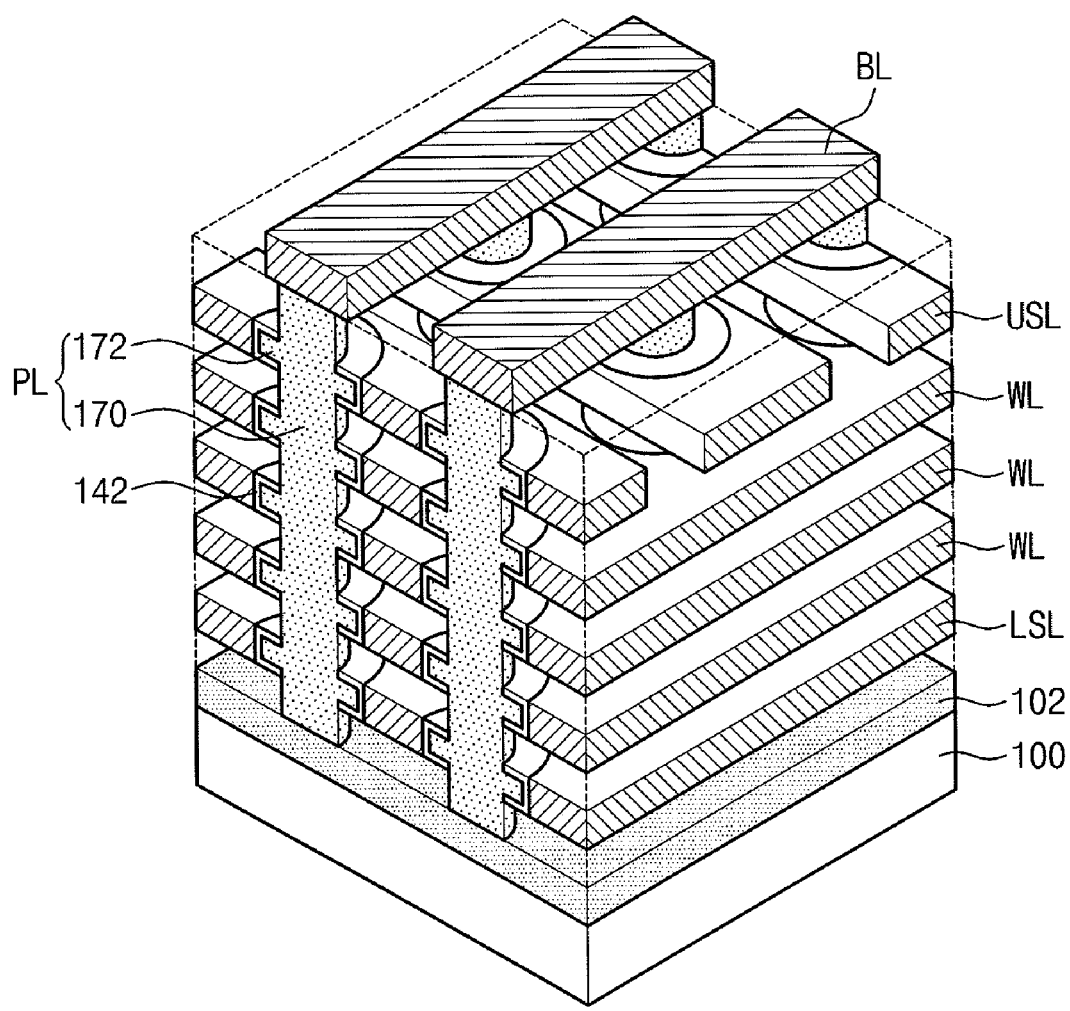
FIG. 2 is a schematic perspective view of a nonvolatile memory device according to an embodiment of the present invention.
Figure 3:
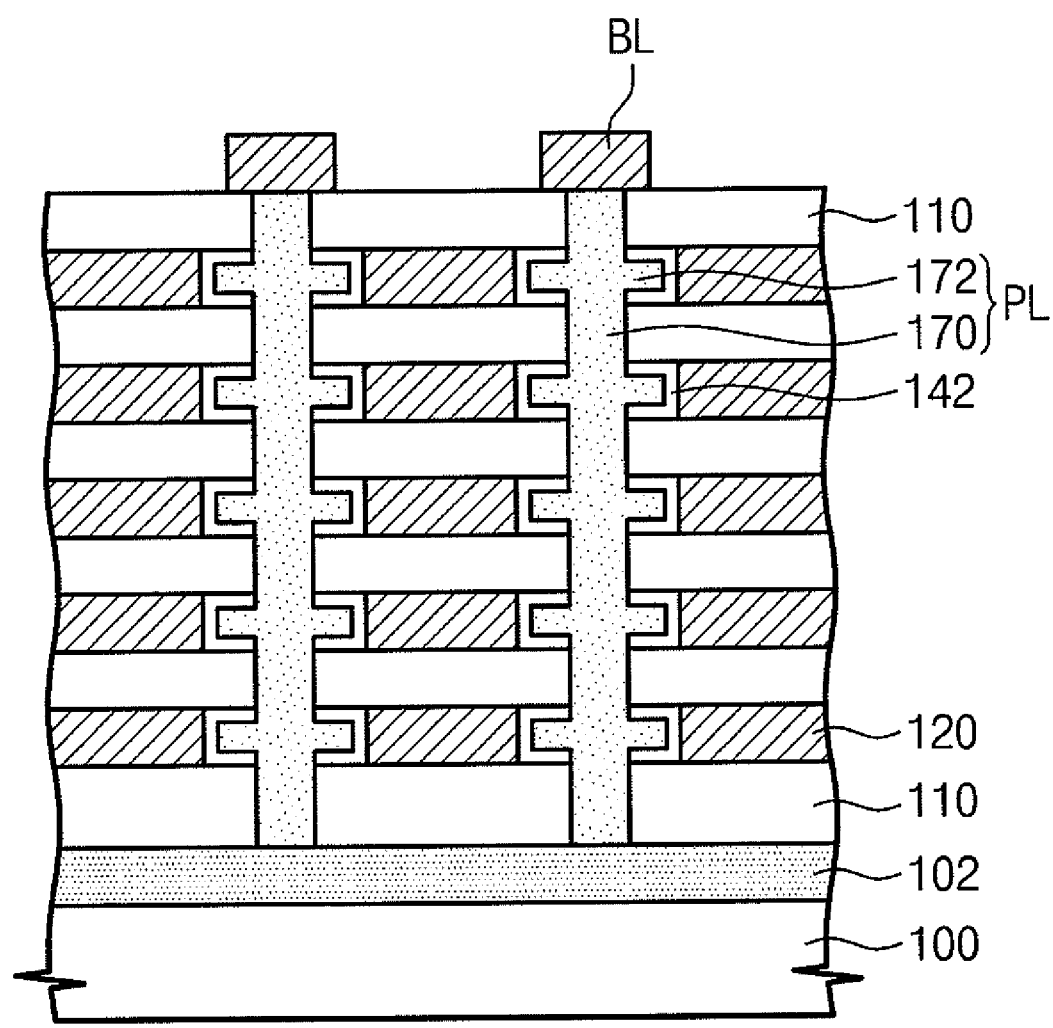
FIG. 3 is a schematic cross-sectional view of a nonvolatile memory device according to an embodiment of the present invention.

FIG. 2 is a perspective view of a nonvolatile memory device according to an embodiment of the present invention. FIG. 3 is a cross-sectional view of a nonvolatile memory device according to an embodiment of the present invention. FIG. 3 shows a cross-sectional view of a cell region of a nonvolatile memory device according to an embodiment of the present invention.

Referring to FIGS. 2 and 3, an interlayer insulating layer 110 and conductive layers (LSL, WL, USL) are alternately stacked on a semiconductor substrate 100.

More specifically, an impurity region 102 (or a well) provided as a common source line (CSL of FIG. 1) is formed in the semiconductor substrate 100 and the interlayer insulating layer 110 and the conductive layers (LSL, WL, USL) are sequentially stacked. The conductive layers (USL, LSL) of the uppermost layer and the lowermost layer among the laminated conductive layers (LSL, WL, USL) are used as select lines and the other conductive layers are used as word lines.

The lower select line (LSL) disposed on the lowermost layer may be formed to have a plate shape or a separated line shape. The upper select line (USL) disposed on the uppermost layer may be formed to have a separated line shape. The word lines (WL) disposed between the lower select line (LSL) and the upper select line (USL) may be formed to have a plate shape respectively. Since the word line of each layer is formed to have a plate shape, the same voltage may be applied to word lines of the memory cells formed on the same layer.

The word lines (WL) may have a gradually reducing area as the word lines (WL) approach the upper portion and edge portions of the laminated interlayer insulating layers 110 and the laminated conductive layers (LSL, WL, USL) may be stacked to have a stair shape.

A plurality of active pillars (PL) penetrates the laminated interlayer insulating layers 110 and the laminated conductive layers (LSL, WL, USL). The active pillars (PL) are formed of a semiconductor material and correspond to strings of the nonvolatile memory device respectively. That is, through the active pillars (PL), a channel of string select transistors and memory cell transistors may be electrically connected.

The active pillars (PL) are separated from each other and may be arranged in a matrix shape when viewed from a top plan view. The active pillars (PL) may penetrate the conductive layers (USL, WL, LSL) to be electrically connected to the impurity region 102 in the semiconductor substrate 100. The active pillars (PL) protrude in a conductive layer direction on each of the conductive layers (USL, WL, LSL).

More specifically, the active pillars (PL) includes a body portion 170 extending in a direction perpendicular to a top surface of the semiconductor substrate 100 and a plurality of protrusions 172 which protrudes toward the conductive layers (USL, WL, LSL) from the body portion 170 and is separated from each other. Each protrusion 172 may have a shape that faces a corresponding conductive layer and surrounds the body portion 170. Thus, each of the conductive layers (USL, WL, LSL) may be separated from the body portion 170 by the protrusion 172. According to an embodiment, the protrusion 172 can be protruded to be greater than a thickness of a charge storage layer pattern 142 and a channel can be formed in the protrusion 172 when the nonvolatile memory device operates.

According to another embodiment, among protrusions and body portion of an active pillar, protrusions corresponding to the uppermost conductive layer (USL) and the lowermost conductive layer (LSL) may be omitted.

The charge storage layer pattern 142 is disposed between the protrusion 172 of the active pillar (PL) and a sidewall of each of the conductive layers (USL, WL, LSL). That is, the charge storage layer pattern 142 is in contact with each of the conductive layers (USL, WL, LSL) and covers a surface of the protrusion 172 of the active pillar (PL). The charge storage layer patterns 142 are removed from a sidewall of the body portion 170 to be electrically isolated to each other. That is, the charge storage layer pattern 142 are in contact with sidewalls of the conductive layers (USL, WL, LSL) and may be isolated between the interlayer insulating layers 110.

According to another embodiment, charge storage layer patterns locally formed on one sidewall of the uppermost conductive layer (USL) and the lowermost conductive layer (LSL) may be omitted.

Bit lines (BL) electrically connected to the active pillar (PL) may be formed on top surfaces of the active pillars (PL). The bit lines (BL) cross the upper select lines (USL) and may be electrically connected to the active pillars (PL) located at the same column or row among the active pillars (PL) arranged in matrix shape.

As described above, when the charge storage layer patterns 142 are separated from each other by each layer, charges trapped in the charge storage pattern 142 may be prevented from being diffused in a direction perpendicular to the word line (WL). That is, after charges are trapped, since data disturbance due to an external or internal stress and a diffusion of electrons according to the elapse of time is prevented, reliability of a nonvolatile memory device having a three-dimensional structure can be improved.

Referring to FIGS. 4 through 9, a method of manufacturing a nonvolatile memory device according to an embodiment is described in detail.

FIGS. 4 through 10 are drawings illustrating a method of manufacturing a nonvolatile memory device according to an embodiment of the present invention.

Figure 4:
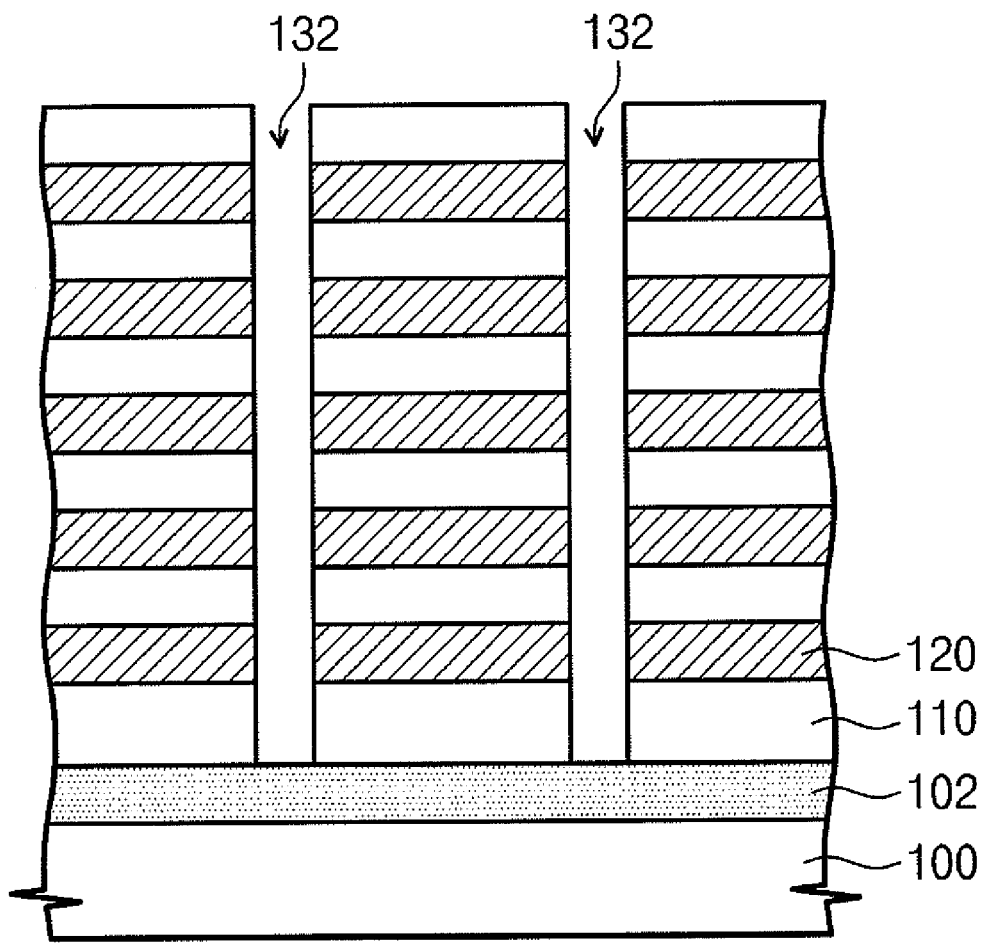
FIGS. 4 through 10 are schematic cross-sectional views illustrating a method of manufacturing a nonvolatile memory device according to an embodiment of the present invention.

Referring to FIG. 4, interlayer insulating devices 110 and conductive layers 120 are sequentially and repeatedly stacked on a semiconductor substrate 100. Here, the semiconductor substrate 100 may include an impurity region 102 (or well). The interlayer insulating layer 110 may be formed of a silicon oxide layer or a silicon nitride layer, and the conductive layer 120 may be formed of a polysilicon layer or a metal layer. The number of the conductive layers 120 to be stacked may change according to a capacity of a nonvolatile memory device.

The interlayer insulating layers 110 and the conductive layers 120 may be stacked to have a plate shape on a memory region of the semiconductor substrate 100 and may have a gradually reducing area as the interlayer insulating layers 110 and the conductive layers 120 approach the upper portion. That is, as depicted in FIG. 3, edge portions of the interlayer insulating layers 110 and the conductive layers 120 may be stacked to have a stair shape. To deposit the edge portions of the interlayer insulating layers 110 and the conductive layers 120, the conductive layers 120 can be stacked by repeating a depositing and patterning of the conductive layer 120. Alternatively, after the interlayer insulating layers 110 and the conductive layers 120 are completely stacked, the stair shaped interlayer insulating layers 110 and the conductive layers 120 may be formed by patterning edge portions of the conductive layers 120 at every layer. Also, the conductive layer 120 located at the uppermost layer may be patterned to have a line shape.

Subsequently, a plurality of first holes 132 penetrating the laminated interlayer insulating layer 110 and laminated conductive layers 120 is formed. More specifically, after a mask pattern (not shown) is formed on the interlayer insulating layer 110, the laminated interlayer insulating layer 110 and laminated conductive layers 120 are selectively and anisotropically etched using the mask pattern to form first holes 132. The first holes 132 formed by the method described above can expose the impurity region 102 of the semiconductor substrate 100 and may gradually reducing diameter as the first holes 132 approach a lower portion as the nature of the an anisotropical etching. At this time, diameters of the first holes 132 may be formed to be smaller than a distance between adjacent first holes 132. A plurality of first holes 132 penetrating the laminated interlayer insulating layers 110 and the laminated conductive layers 120 may be formed to be matrix shape when viewed from a top plan view.

Figure 5:
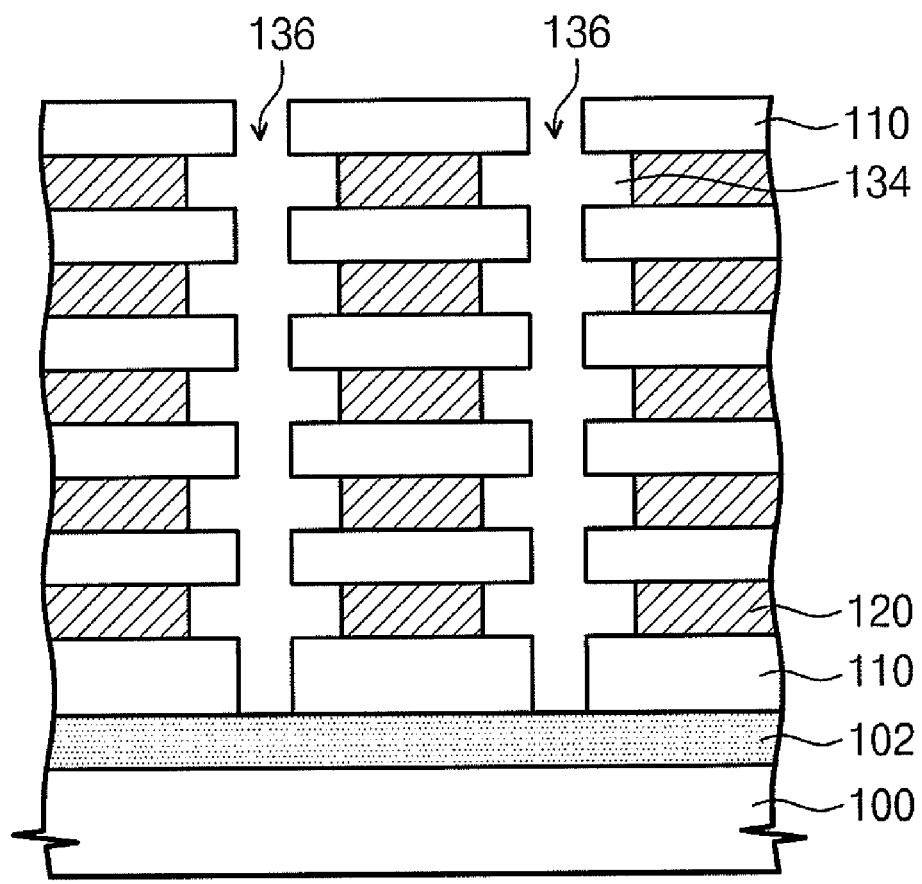

Referring to FIG. 5, sidewalls of the conductive layers 120 exposed by the first holes 132 are selectively etched to form second holes 136 in which extended portions 134 are formed. More specifically, a portion of the conductive layers 120 exposed by the first holes 132 can be isotropically etched by supplying an etching solution capable for selectively etching the conductive layers 120 to insides of the first holes 132. When an etching solution is supplied through the first holes 132, a diameter of a hole formed in the conductive layer 120 may be greater than a diameter of a hole formed in the interlayer insulating layer 110 because an etch rate of the conductive layers 120 is greater than an etch rate of the interlayer insulating layers 110. Thus, the extended portions 134 extending to be parallel to the conductive layers 120 may be formed on each layer on which the conductive layers 120 are formed. That is, the second holes 136 having the extended portions 134 separated from each other over the laminated layers and vertically penetrating the interlayer insulating layers 110 and the conductive layers 120.

Figure 6:
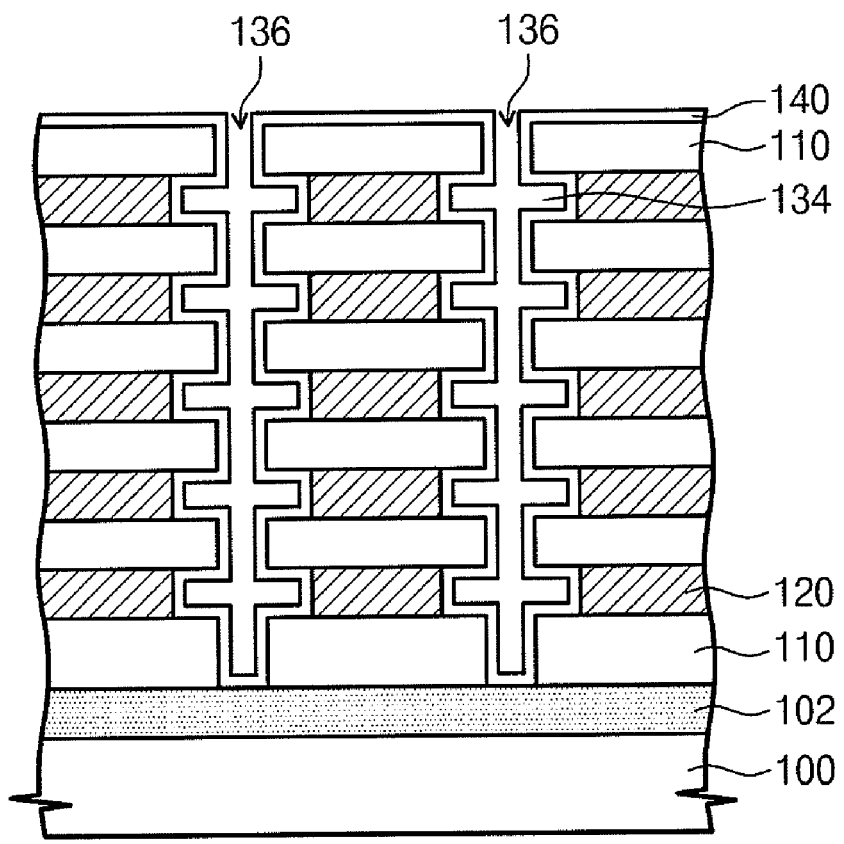

Referring to FIG. 6, a charge storage layer 140 is conformally stacked along a surface of the second hole 136. That is, the charge storage layer 140 may be formed on sidewalls of the interlayer insulating layers 110, sidewalls of the conductive layers 120 and the impurity region 102 exposed by the second hole 136. Here, the charge storage layer 140 may be formed by sequentially depositing a charge blocking layer, a charge trapping layer and a charge tunneling layer. An oxide layer, a nitride layer and an oxide layer may be sequentially formed on a surface of the second hole 136.

Figure 7:
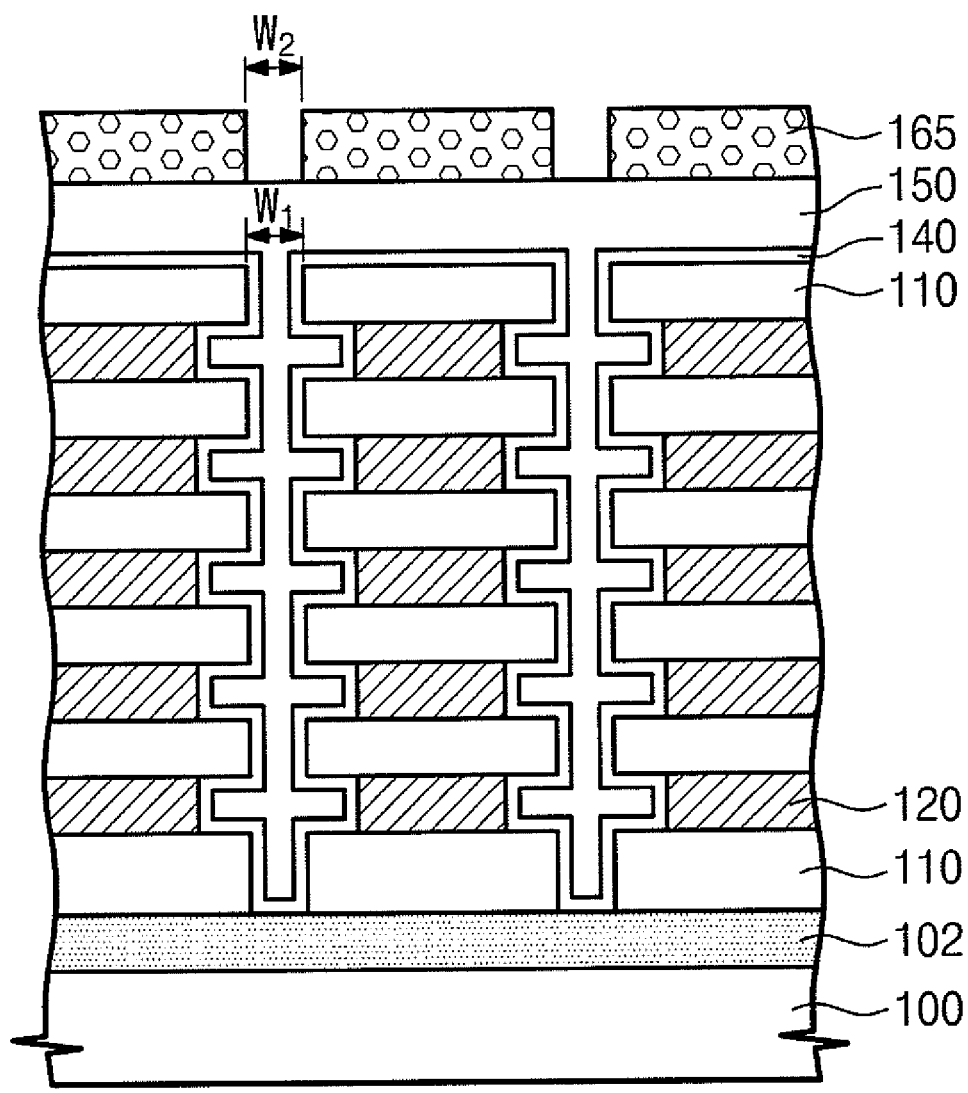

Referring to FIG. 7, the second hole 136 including the charge storage layer 140 is filled with a sacrificial layer 150. The sacrificial layer 150 can be formed to be sufficiently thick to a top surface of the charge storage layer 140. The sacrificial layer 150 may be formed of material having an etching selectivity with respect to the charge storage layer 140 and a superior gap filling characteristic. For example, the sacrificial layer 150 may be formed of borosilicate glass (BSG), phosphosilicate glass (PSG), borophosphosilicate glass (BPSG), tetra ethylortho silicate (TEOS), tonen silazene (TOSZ), undoped silicate glass (USG) or spin on glass (SOG).

After forming the sacrificial layer 150, the sacrificial layer 150 may be planarized down to the top surface of the interlayer insulating layer 110. A mask pattern 165 for removing the charge storage layer 140 formed on a sidewall of the interlayer insulating layer 110 is formed on the planarized sacrificial layer 150. A width ($W_2$) of the sacrificial layer 150 exposed by the mask pattern 165 may be greater than a width ($W_1$) of the hole formed by the interlayer insulating layer 110. Alternatively, the mask pattern used when forming the first holes (132 of FIG. 4) may be used as the mask pattern 165.

Figure 8:
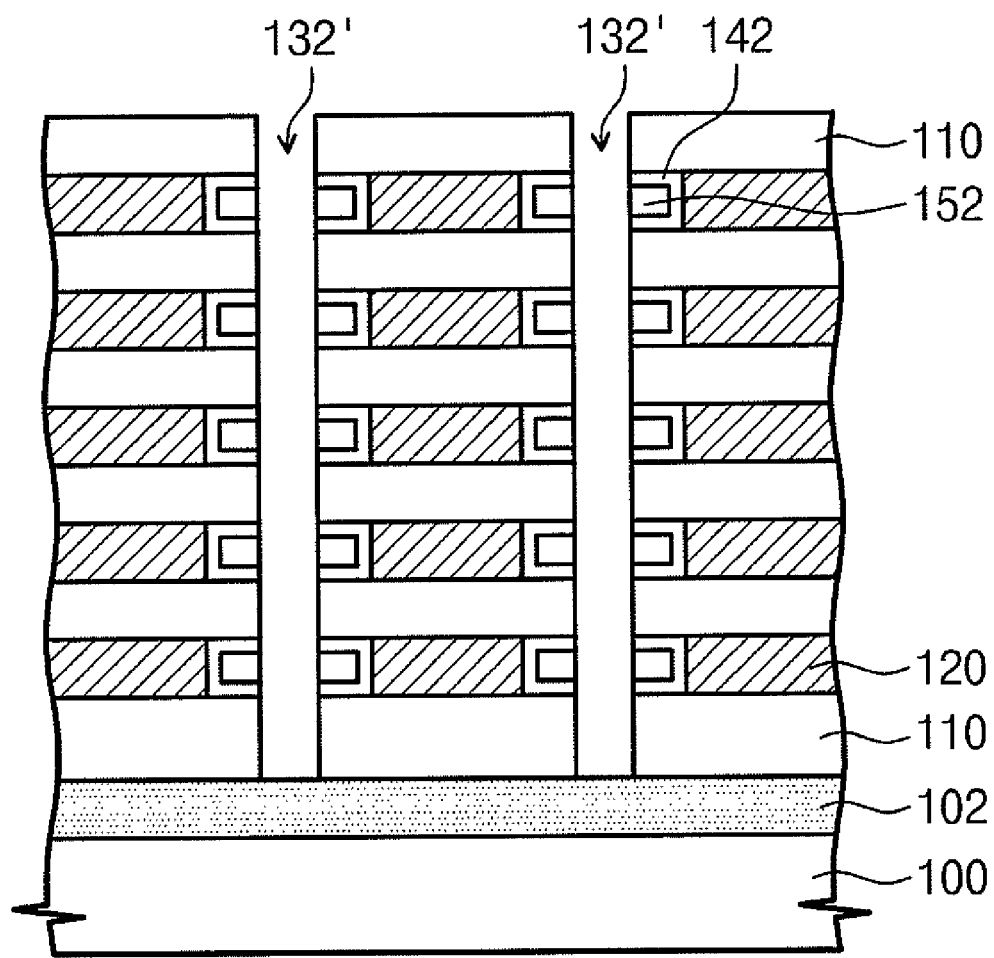

Referring to FIG. 8, a portion of the charge storage layer 140 and the sacrificial layer 150 may be anisotropically etched using the mask pattern 165 to form third holes 132' penetrating the laminated interlayer insulating layers 110 and the laminated conductive layers 120. The third holes 132' can expose the impurity region 102 and sidewalls of the laminated interlayer insulating layers 110. A diameter of the third hole 132' may be greater the diameter of the first hole 132 and may be smaller than the diameter of the extended portion 134. When forming the third holes 132', the charge storage layer 140 on a sidewall of the interlayer insulating layer 110 and a portion of the charge storage layer 140 on upper and lower sides of the interlayer insulating layer 110 may be removed. A portion 142 of the charge storage layer 140 and a portion 152 of the sacrificial layer 150 remain between the laminated interlayer insulating layers 110.

Since the charge storage layers 140 formed on sidewalls of the interlayer insulating layers 110 are removed by forming the third holes 132', the charge storage layer patterns 142 having a shape of being inserted in the extended portion (134 of FIG. 5) may be formed. That is, the charge storage layer patterns and the sacrificial layers may be formed between the third hole 132' and sidewalls of the conductive layers 120. The charge storage layer pattern 142 is conformally formed on a surface of the interlayer insulating layers 110 and the conductive layers 120.

Without a mask pattern, the charge storage layer 140 and the sacrificial layers 150 are anisotropically etched using the interlayer insulating layers 110 to locally form the charge storage layer pattern 142 in the extended portions 134.

Figure 9:
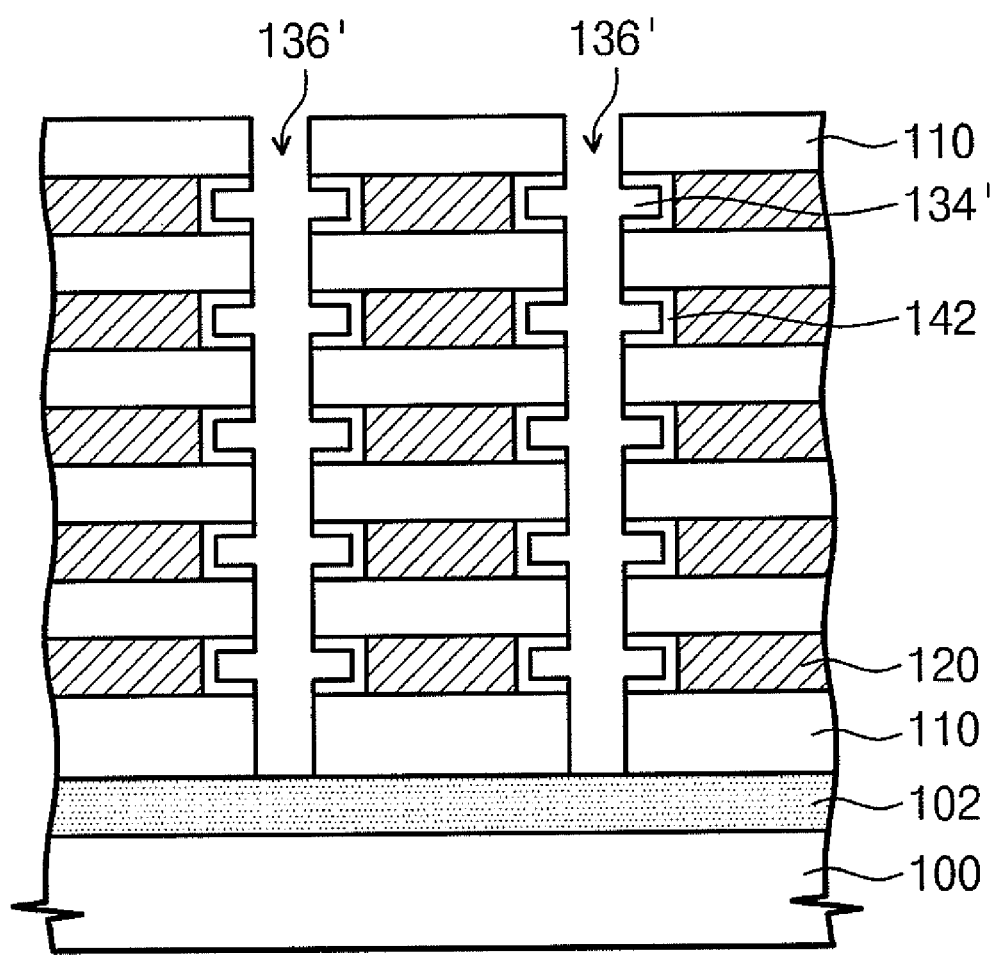

Referring to FIG. 9, the sacrificial layers 152 remaining between the interlayer insulating layers 110 are removed. The sacrificial layers 152 may be removed using a wet etching solution having an etching selectivity with respect to the charge storage layer pattern 142 and the interlayer insulating layers 110. That is, the sacrificial layers 152 remaining on the charge storage layer pattern 142 may be removed by supplying a wet etching solution to the third hole 132'. As a result, fourth holes 136' having extended portions 134' may be formed between the interlayer insulating layers 110. Surfaces of the charge storage layer patterns 142 are exposed by the extended portions 134'.

Figure 10:
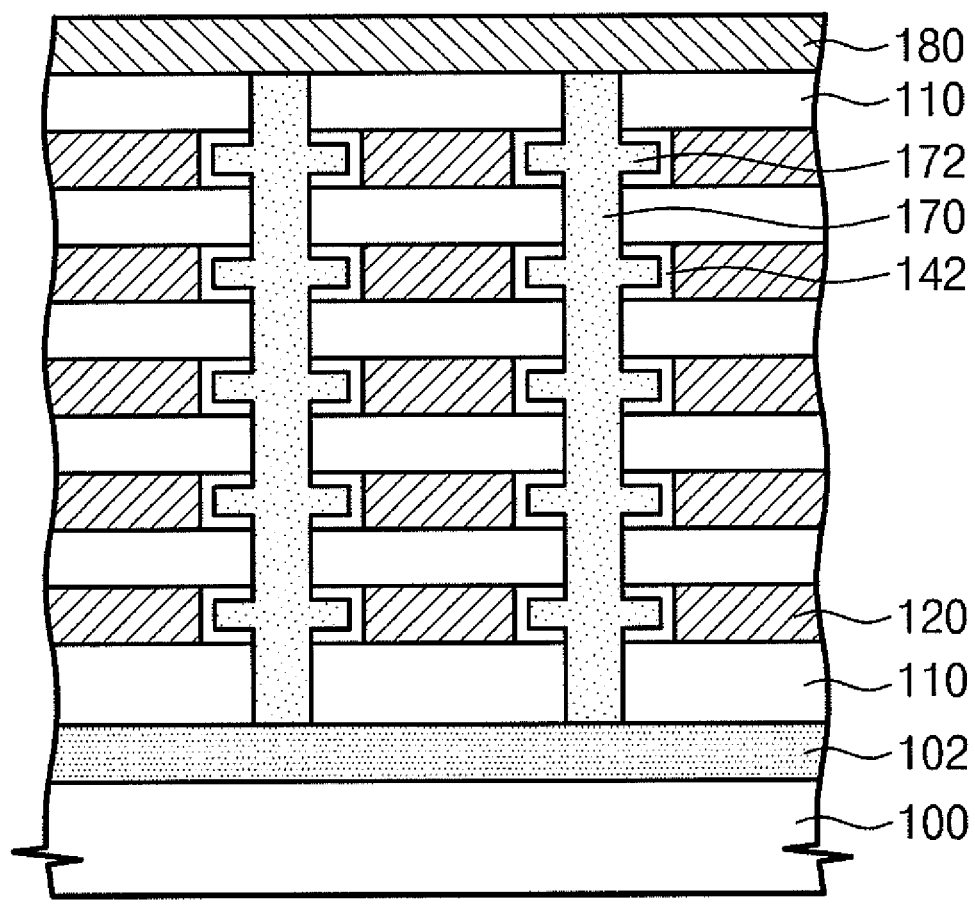

Referring to FIG. 10, the fourth holes 136' having the extended portions 134' are filled with semiconductor material to form active pillars 170 and 172. At this time, the extended portions 134' formed between the interlayer insulating layers 110 can be filled with semiconductor material. The semiconductor material may be a polycrystalline semiconductor or a single crystalline semiconductor. Subsequently, the semiconductor material filling the fourth holes 136' is planarized down to the top surface of the uppermost interlayer insulating layer 110.

The active pillars may be comprised of body portions 170 penetrating the laminated interlayer insulating layers 110 and the laminated conductive layers 120, and protrusions 172 protruding toward the conductive layers 120 from the body portions 170. Since the charge storage layer patterns 142 are formed in the extended portions 134', upper and lower charge storage layer patterns 142 have a structure of being separated from each other.

Hereinafter, a nonvolatile memory device according to another embodiment and a method of manufacturing the same are described in detail.

Figure 11:
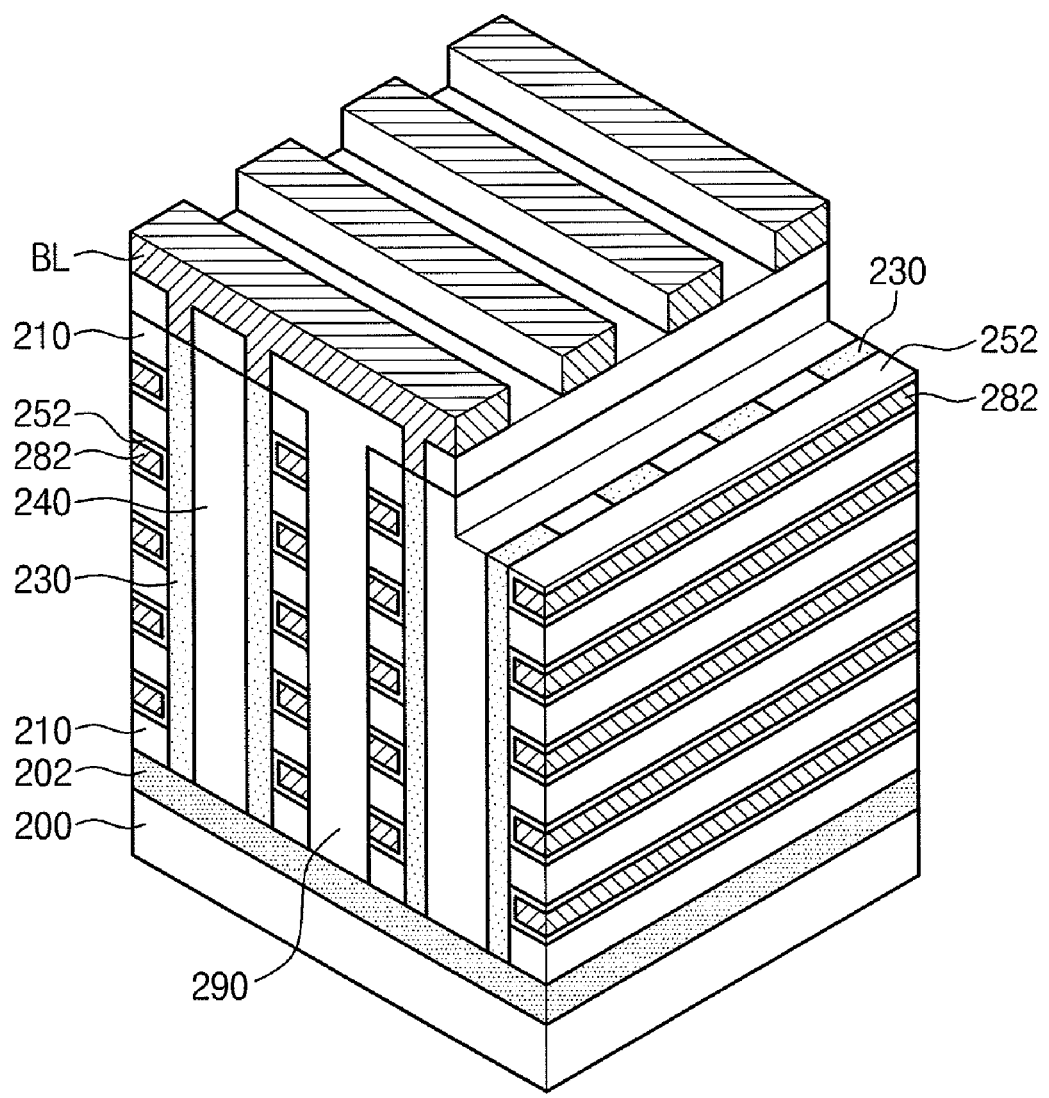
FIG. 11 is a schematic perspective view of a nonvolatile memory device according to another embodiment of the present invention.

FIG. 11 is a perspective view of a nonvolatile memory device according to another embodiment of the present invention.

Referring to FIG. 11, an impurity region 202 (or well) provided as a common source line may be formed in a semiconductor substrate 200 and an insulating layer and a conductive layer are alternately stacked on the impurity region 202. More specifically, the insulating layer and the conductive layer may be patterned in a line shape and word lines 282 separated from each other may be formed on the conductive layers respectively. That is, structures that the word line 282 and an insulating line 210 are alternately stacked may be formed to be separated from each other on the semiconductor substrate 200. The word lines 282 are three-dimensionally disposed on the semiconductor substrate 200.

Active patterns 230 are disposed to be spaced apart from each other on first sidewalls of the word lines 282 and the insulating lines 210, and an insulating film 290 is formed on a second sidewall opposite to the first sidewall. The active patterns 230 may be formed in a line shape of being perpendicular to the semiconductor substrate 200. The active patterns 230 are formed to face active patterns 230 formed on a first sidewall of horizontally adjacent word lines 282 and the insulating lines 210. An insulating film 240 fills a space between the active patterns 230. That is, the active patterns 230 extend in a direction perpendicular to the semiconductor substrate 200 and a plurality of word lines 282 is formed to cross each other on one sidewall of each active pattern 230.

A charge storage layer pattern 252 is disposed between the active pattern 230 and the word line 282. The charge storage layer pattern 252 may extend in a direction of the word line 282. The charge storage layer pattern 252 may be locally formed between vertically adjacent interlayer insulating layer pattern 210.

More specifically, the charge storage layer pattern 252 can conformally cover a portion of a side wall of the active patterns 230 and a top surface and a bottom surface of vertically adjacent interlayer insulating layer patterns 210. That is, the charge storage layer patterns 252 are formed between the interlayer insulating layers 210 that are stacked to be separated from each other and are electrically isolated from other charge storage layer patterns 252 located at an upper part and a lower part thereof.

Also, the active patterns 230 extending in a direction perpendicular to the semiconductor substrate 200 are electrically connected to bit lines (BL) crossing the word lines 282. The bit lines (BL) may be directly in contact with a top surface of the active pattern 230 or may be electrically connected to the active pattern 230 through bit line contacts.

Since the charge storage layer patterns 252 are separated from each other in a direction perpendicular to the semiconductor substrate 200, charges trapped in the charge storage layer patterns 252 can be prevented from diffusing to an upper part and a lower part thereof along a surface of the active pattern 230. Thus, in the three-dimensional nonvolatile memory device, a degradation of reliability due to a loss of charges can be prevented.

Hereinafter, referring to FIGS. 12 through 21, a method of manufacturing a nonvolatile memory device according to another embodiment of the present invention is described in detail.

Figure 12:
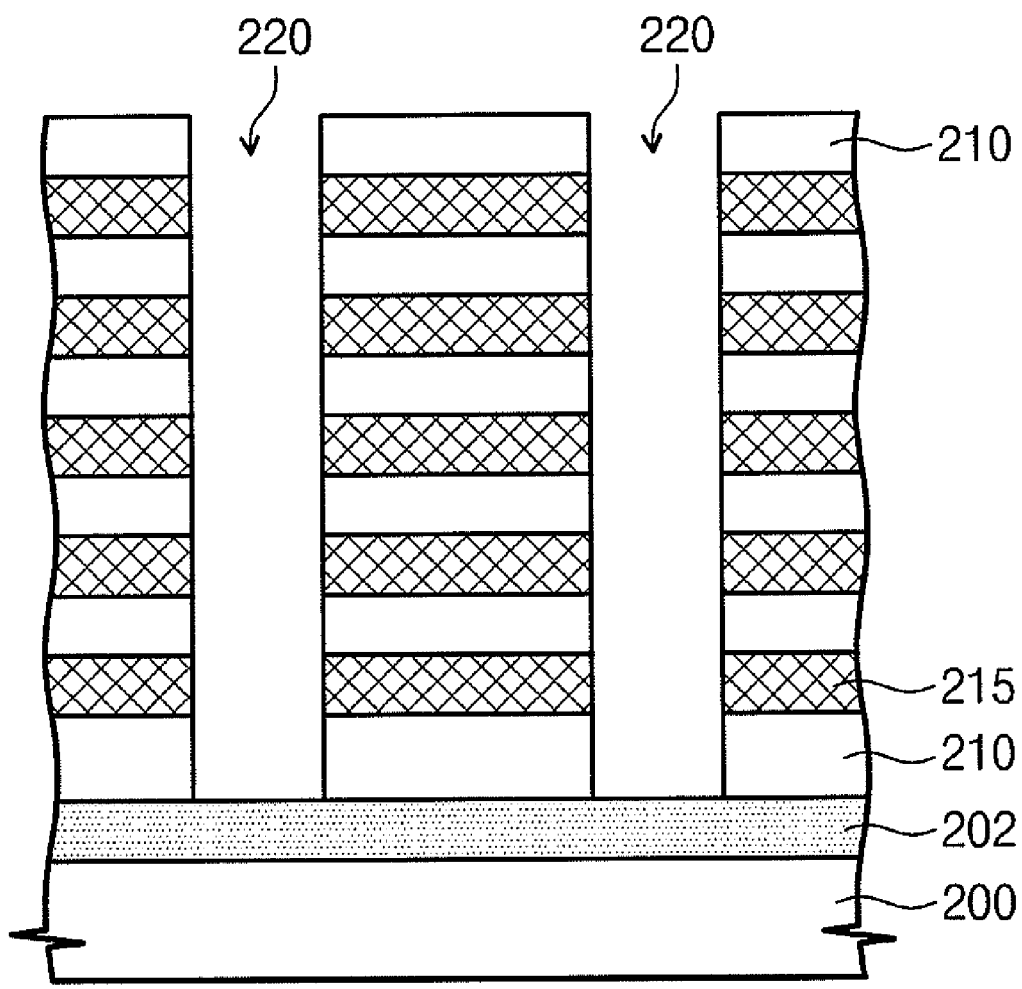
FIGS. 12 through 21 are schematic cross-sectional views illustrating a method of manufacturing a nonvolatile memory device according to another embodiment of the present invention.

Referring to FIG. 12, first and second insulating layers 210 and 215 having an etching selectivity different from each other are alternately stacked on a semiconductor substrate 200. The first and second insulating layers 210 and 215 are formed of materials having a wet etch rate different from each other. For example, the first and second insulating layers 210 and 215 may be formed of a silicon oxide layer and a silicon nitride layer respectively.

First trenches 220 having a line shape are formed in the laminated first and second insulating layers 210 and 215. The first trenches 220 can be formed using a conventional photolithography process and an etching process. A first sidewall of the laminated first and second insulating layers 210 and 215 can be exposed by forming the first trenches 220.

Figure 13:
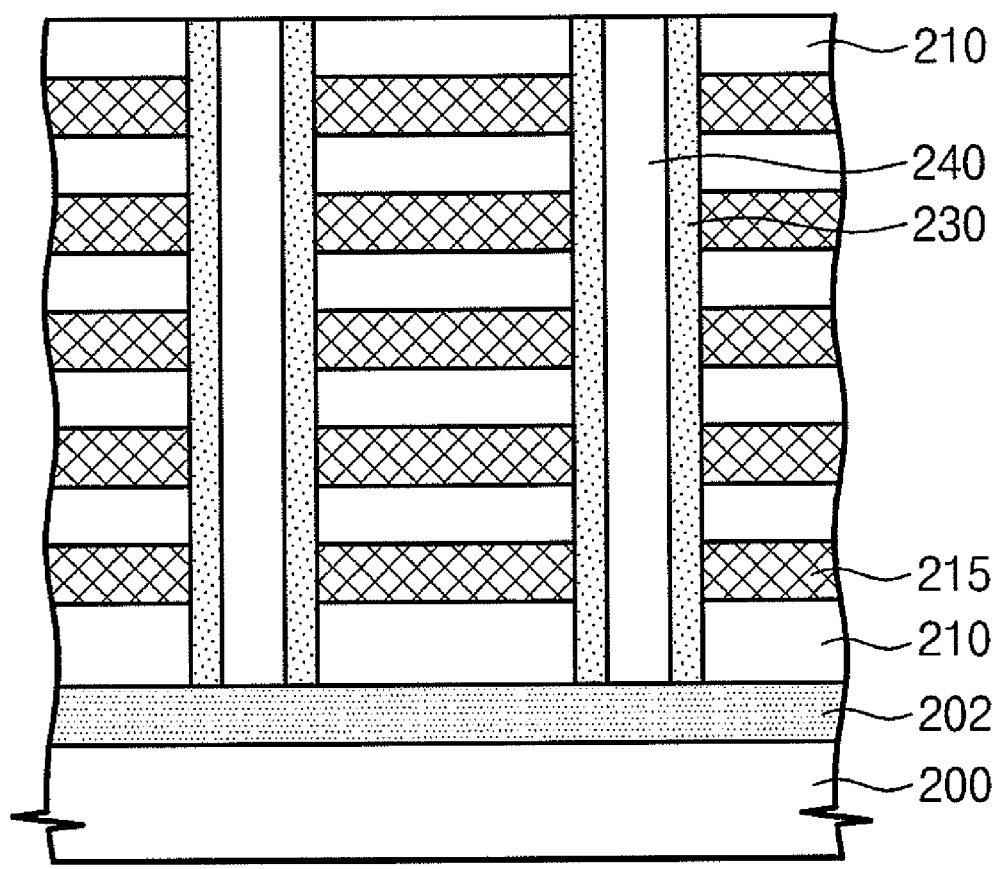

Referring to FIG. 13, a semiconductor layer 230 is formed on the first sidewall of the first and second insulating layers 210 and 215 exposed by the first trenches 220. A method of forming the semiconductor layer 230 is as follows. A semiconductor material is conformally deposited along the first sidewall of the laminated first and second insulating layers 210 and 215. After that, the semiconductor material is anisotropically etched to remove the semiconductor material formed on an impurity region 202 and on the first insulating layer 210. As a result, the semiconductor layer 230 covering the first sidewall of the first and second insulating layers 210 and 215 can be formed. After forming the semiconductor layer 230, an insulating material is buried in the first trench 220, and then planarized to form an insulating layer 240 between the semiconductor layers 230.

A semiconductor layer may be formed in the first trenches 220 by performing an epitaxial process using the semiconductor substrate 200 exposed by the first trenches 220 as a seed layer.

Figure 14:
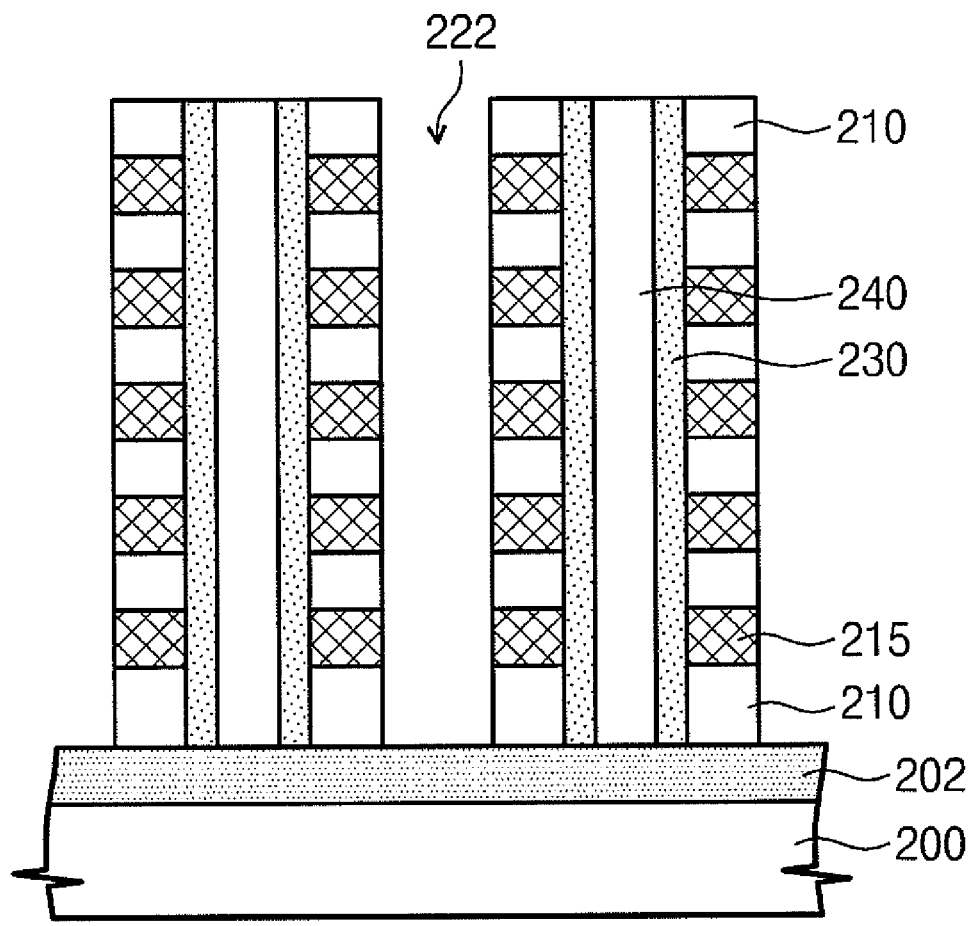

Referring to FIG. 14, second trenches 220 having a line shape are formed between the first trenches 220 filled with the insulating layer 240. The second trenches 222 can expose a second sidewall of the laminated first and second insulating layers 210 and 215. The laminated first and second insulating layers 210 and 215 can be patterned to have a line shape by forming the second trenches 222.

Figure 15:
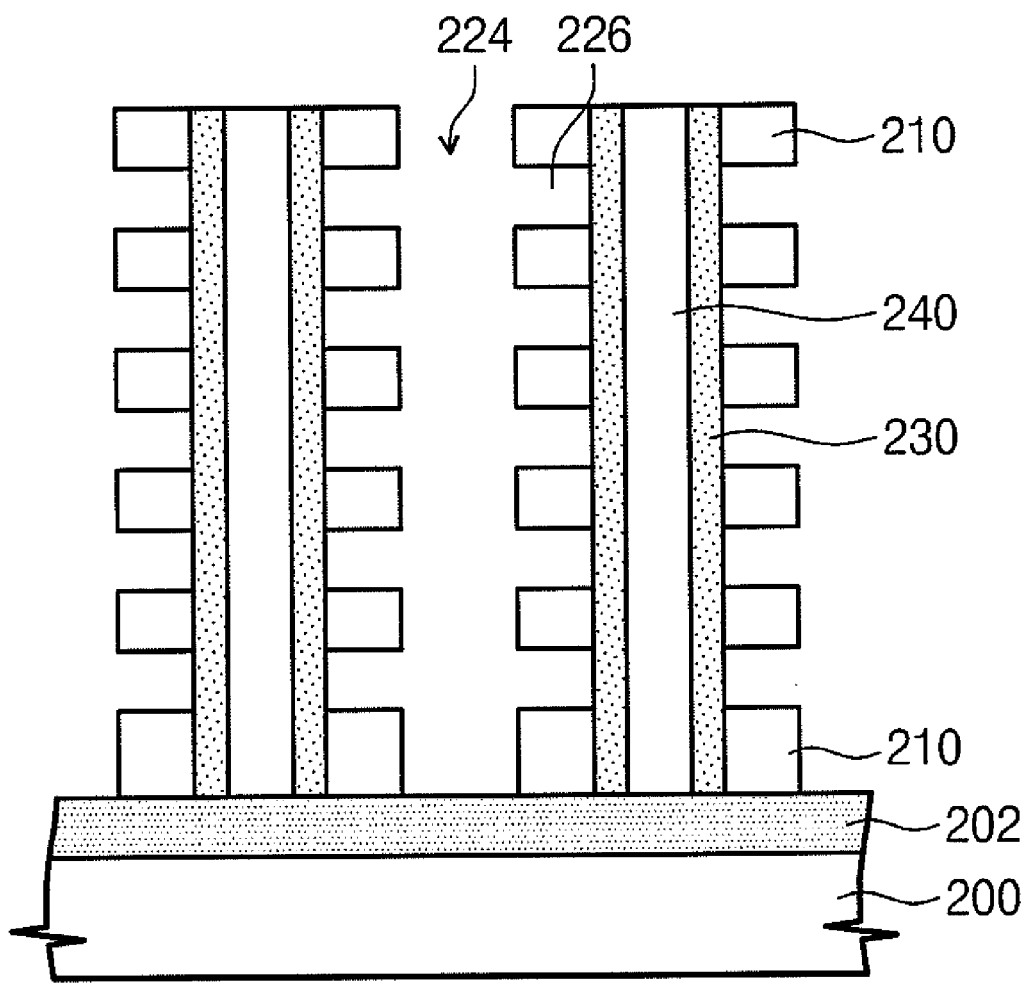

Referring to FIG. 15, an etching solution having a high etching selectivity with respect to the second insulating layer 215 is supplied to the second trenches 222 exposing the second sidewall of the laminated first and second insulating layers 210 and 215 to remove the second insulating layers 215. That is, extended portions 226 extending in a direction parallel to the semiconductor substrate 200 may be formed between the laminated first insulating layers 210 and a portion of the sidewall of the semiconductor layer 230 may be exposed by the extended portions 226. In other words, third trenches 224 exposing the impurity region 202 and having the extended portions 226 exposing the sidewall of the semiconductor layer 230 may be formed between the insulating layers 230 buried in the first trenches 220.

Figure 16:
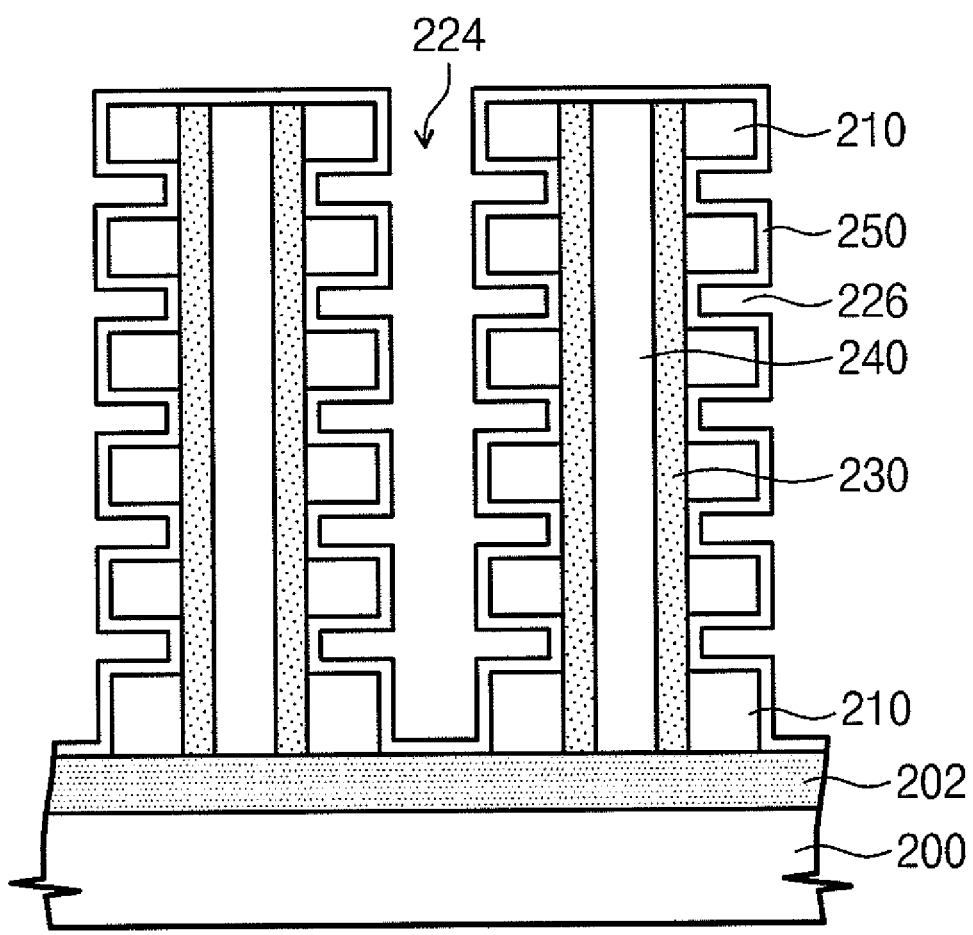

Referring to FIG. 16, a charge storage layer 250 is conformally formed along a surface of the third trenches 224. That is, the charge storage layer 250 is conformally formed along a surface of the extended portions 226 exposing a portion of the semiconductor layer 230. The charge storage layer 250 may be formed on a portion of the sidewall of the semiconductor layer 230, the second sidewalls of the first insulating layers 210 and top surfaces and bottom surfaces of the first insulating layers 210 using a chemical vapor deposition (CVD) process. The charge storage layer 250 can be formed by sequentially depositing a charge tunneling layer, a charge trapping layer and a charge blocking layer. For example, the charge tunneling layer may be formed of a silicon oxide layer ($SiO_2$) or a silicon nitride layer (SiON). Also, the charge tunneling layer may be formed of a high dielectric material such as $AlO_3$, $HfO_2$, $ZrO_2$, $LaO_3$, $TaO_3$, $TiO_2$, $SrTiO_3$ (STO), $(Ba,Sr)TiO_3$ (BST) or a complex layer stacked by combinations thereof. The charge tunneling layer may be formed of a material having a dielectric constant lower than the charge blocking layer. The charge trapping layer may be formed of a silicon nitride layer and/or a silicon oxynitride layer. The charge blocking layer may, for example, be formed of a high dielectric material such as $AlO_3$, $HfO_2$, $ZrO_2$, $LaO_3$, $TaO_3$, $TiO_2$, $SrTiO_3$ (STO), $(Ba,Sr)TiO_3$ (BST) or a complex layer stacked by combinations thereof. The charge blocking layer may be formed of a material having a dielectric constant higher than the charge tunneling layer.

Figure 17:
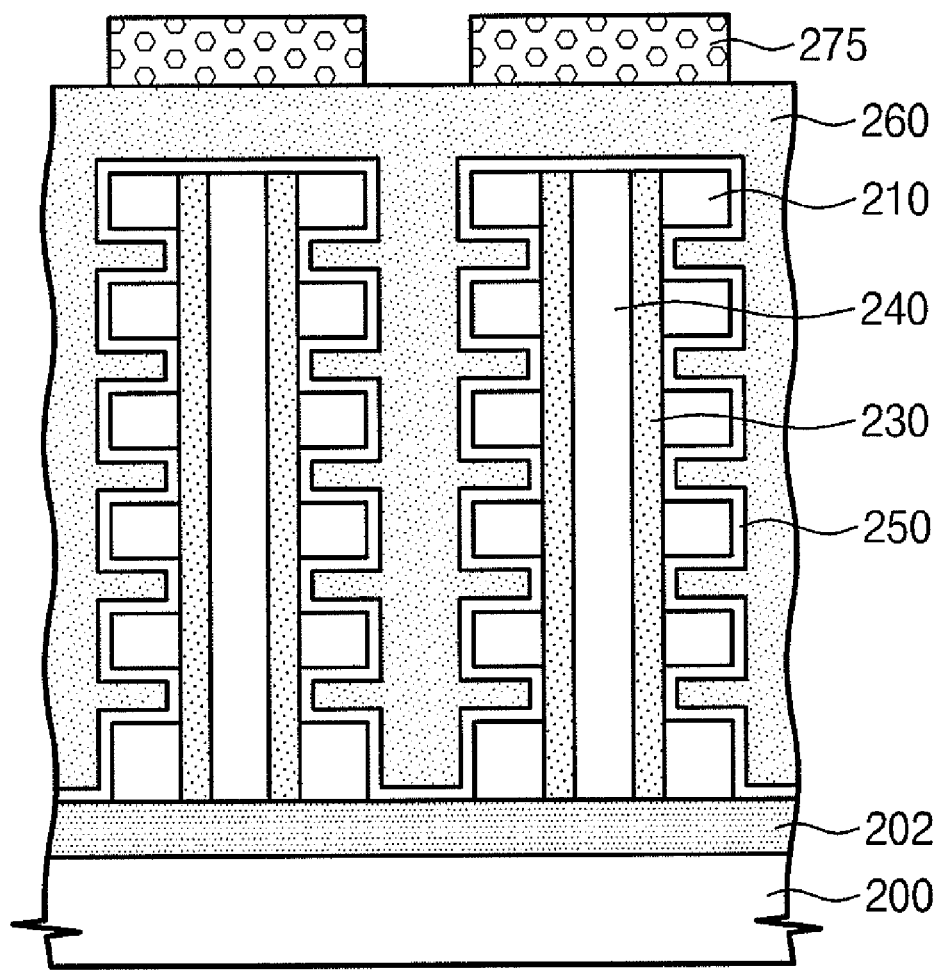

Referring to FIG. 17, a sacrificial layer 260 is formed by filling the third trenches 224 with a sacrificial material.

A material having a superior gap filling characteristic may be used as the sacrificial layer 260 and the sacrificial layer 260 is formed to have a sufficient thickness on a top portion of the uppermost first insulating layer 210. The sacrificial layer 260 may be planarized down to the top surface of the first insulating layer 210. After that, a mask pattern 275 for exposing the second sidewall of the first insulating layer 210 is formed on the sacrificial layer 260 or the first insulating layer 210. The mask pattern 270 may be identical to the mask pattern for forming the second trench 222.

Figure 18:
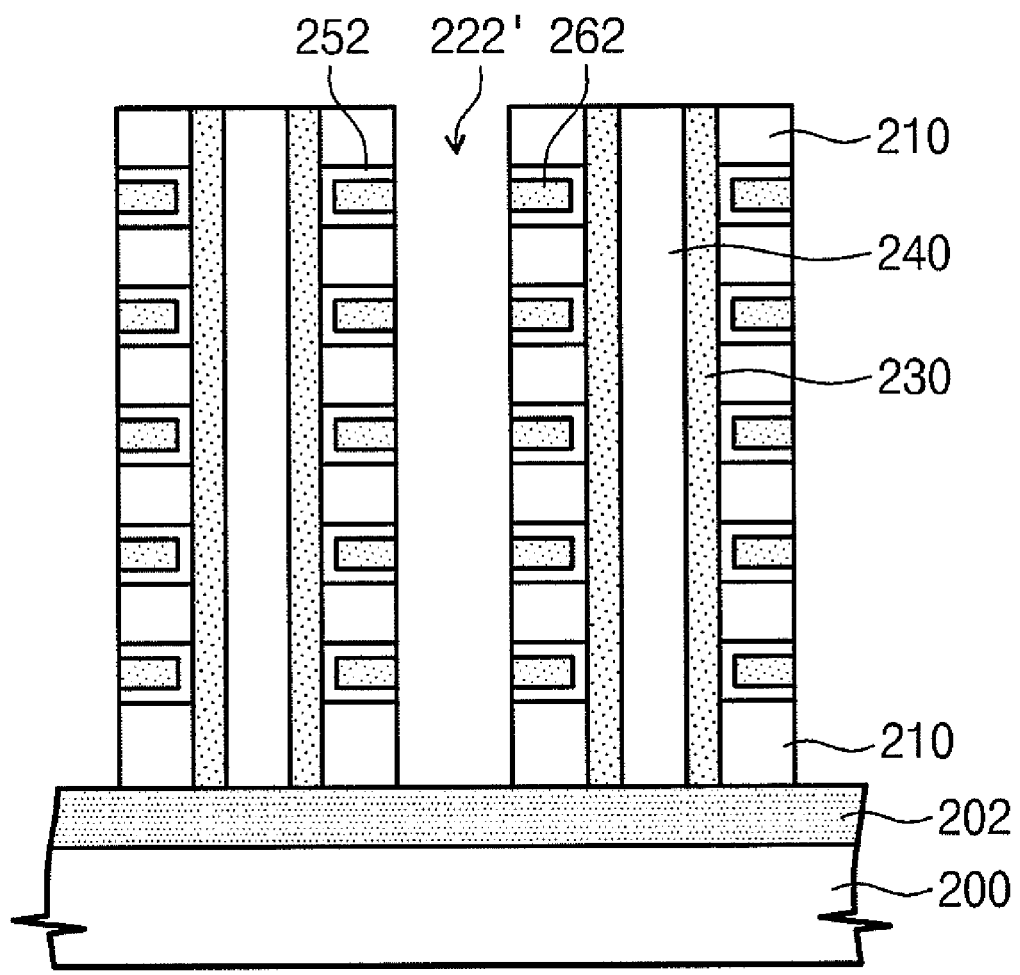

Referring to FIG. 18, the sacrificial layer 260 and a charge storage layer 250 formed on the second sidewall of the first insulating layer 210 are etched using the mask pattern 275. As a result, fourth trenches 222' can be formed between the insulating layers 240 buried in the first trenches 220. The fourth trenches 222' expose the second sidewall of the first insulating layer 210 and the impurity region 202 again. A width of the fourth trench 222' may be equal to or greater than a width of the second trench 222.

The charge storage layers 250 conformally formed on a surface of the second trenches 222 can be divided into charge storage patterns 252 by forming the fourth trenches 222'. That is, the charge storage patterns 252 may be locally formed in the extended portions 226 formed between the laminated first insulating layers 210. A portion 262 of the sacrificial layer 260 remains on the charge storage pattern 252 in the extended portions 226.

Figure 19:
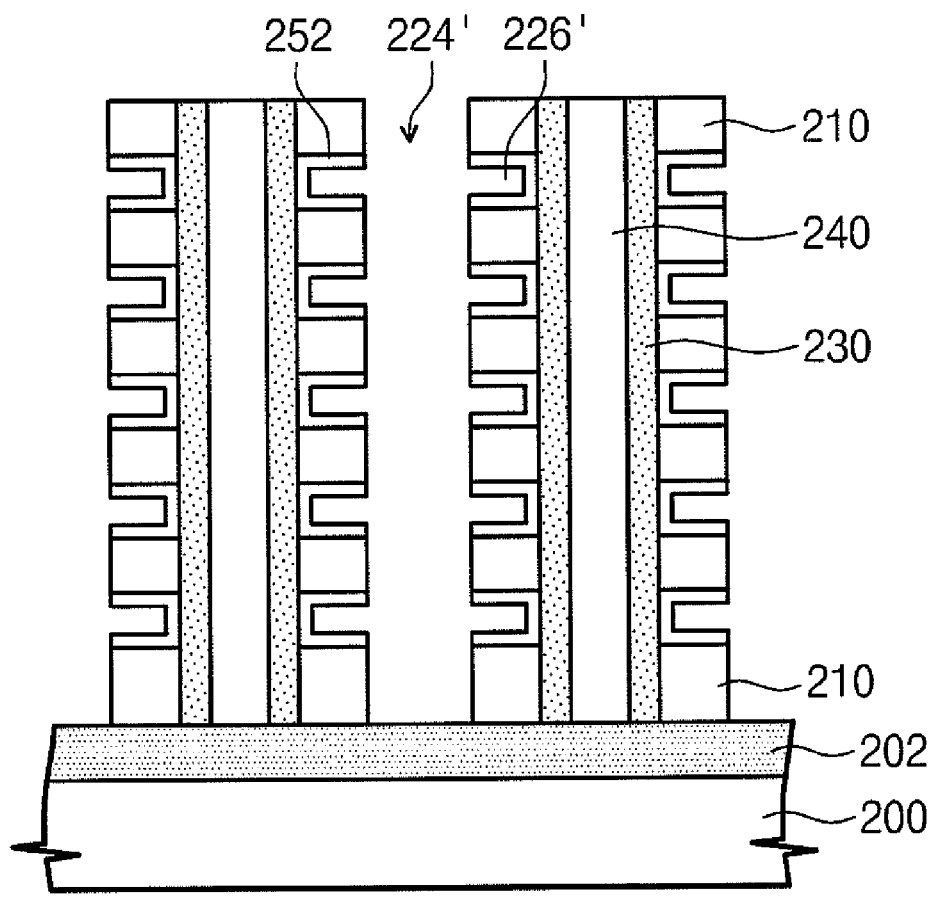

Referring to FIG. 19, the sacrificial layers 262 remaining in the extended portions 226 are removed using a wet etching process. The remaining sacrificial layers 262 can be selectively removed by a wet etching process using an etching solution having a high etching selectivity with respect to the sacrificial layer 262. Thus, a surface of the charge storage patterns 252 can be exposed by a fifth trench 224' including extended portions 226'.

Figure 20:
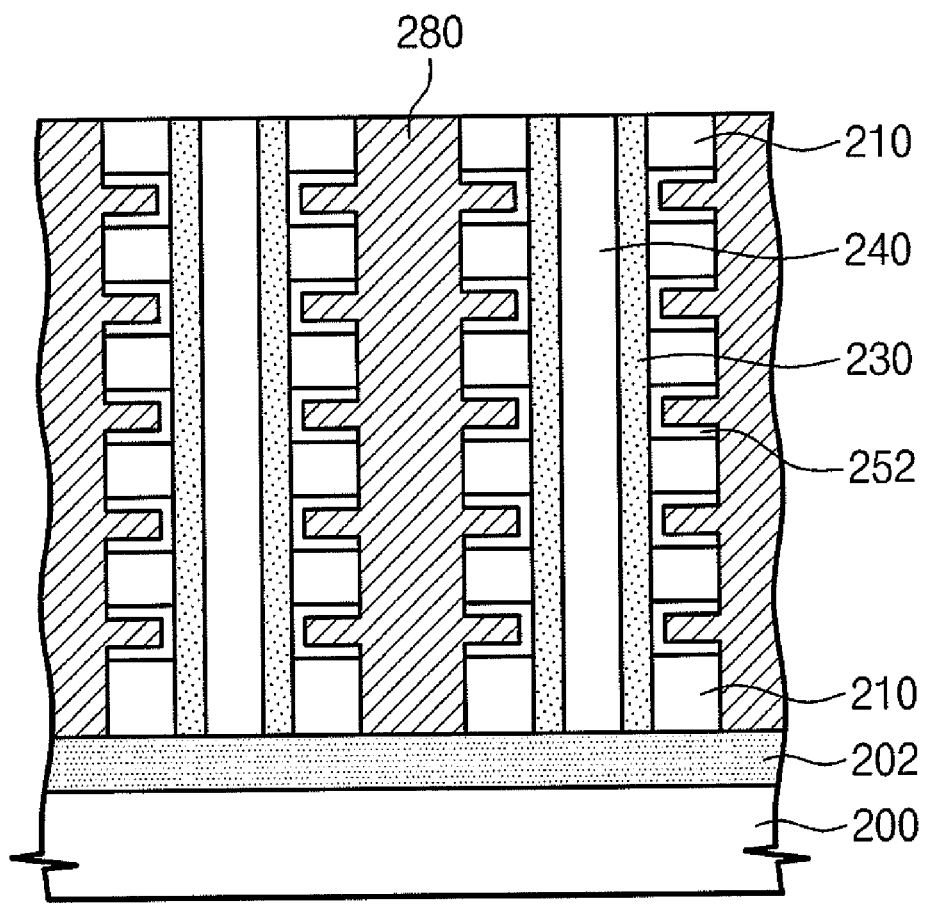

Referring to FIG. 20, a gate conductive layer 280 completely filling the fifth trenches 224' is formed on the charge storage layer patterns 252. The gate conductive layer 280 can be formed using a chemical vapor deposition (CVD) process. Thus, the gate conductive layer 280 can fill the extended portion 226'. That is, the gate conductive layers 280 in the extended portion 226' can be electrically connected to each other. The gate conductive layer 280 can be formed of a polysilicon layer or a metal layer.

Figure 21:
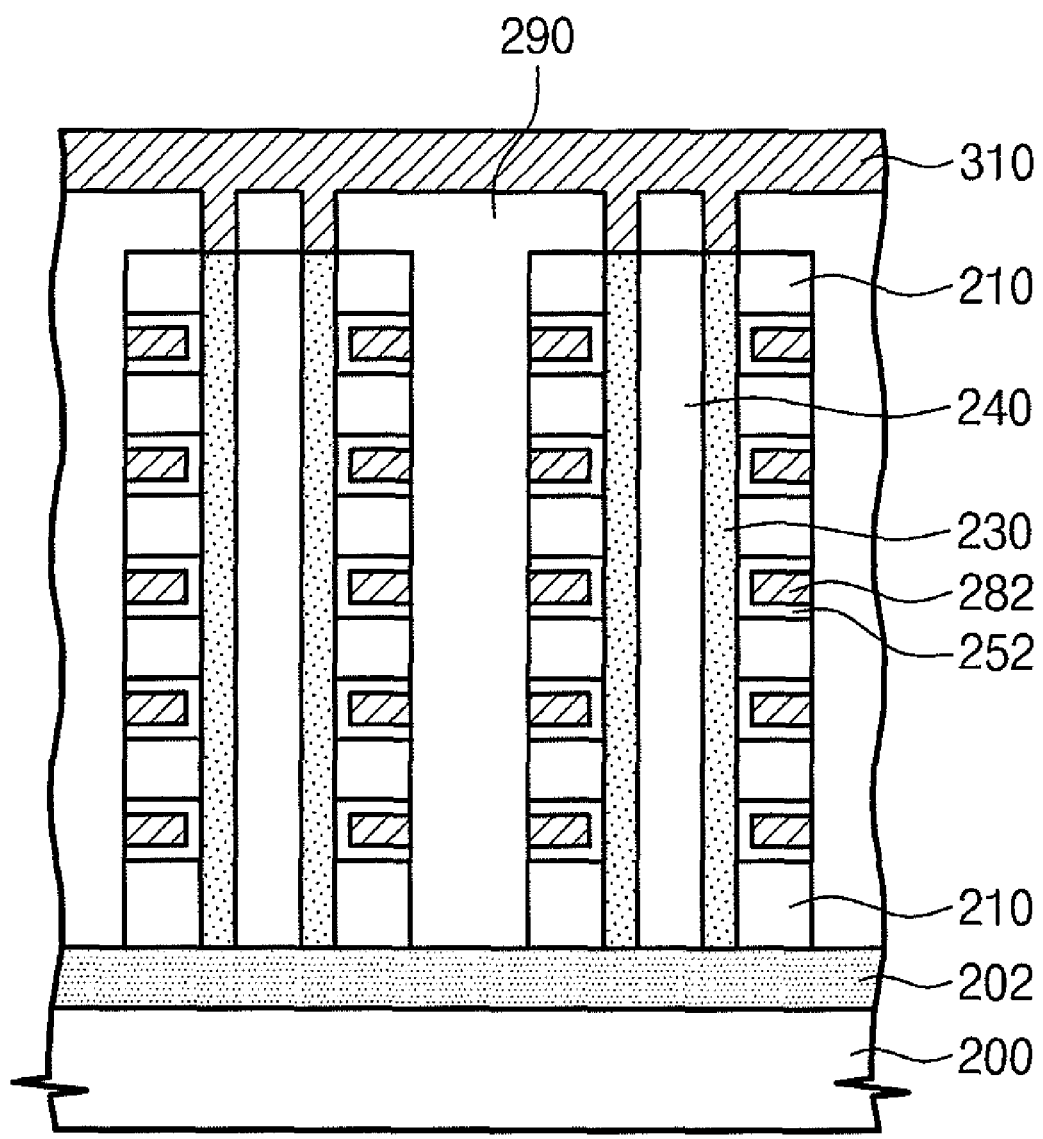

Referring to FIG. 21, the gate conductive layer 280 is patterned to form charge storage patterns 252 and conductive lines 282 in the extended portions 226'. That is, the gate conductive layer 280 can be divided into word lines 282 having a line shape. Thus, the word lines 282 can be formed between the laminated first insulating layer patterns 210 may have a structure of being stacked in a direction perpendicular to the semiconductor substrate 200. After dividing the word lines 282 respectively, an insulating layer 290 is buried in laminated word lines 282 and the first insulating layer patterns 210 and a top surface of the insulating layer 290 is planarized.

After that, a process dividing the semiconductor layer 230 covering the first sidewall of the charge storage layer patterns 252 into lines respectively may be performed. As depicted in FIG. 11, the semiconductor layers 230 may be formed to be spaced apart from each other in a line shape on the first side wall of the laminated word lines 282. Bit lines (BL) crossing the word lines 282 and electrically being connected to the semiconductor layer can be formed on the semiconductor layers 230 divided in a line shape.

In this manner, in a three-dimensional nonvolatile memory device, when the word lines 282 are stacked in a direction perpendicular to the semiconductor substrate 200, the charge storage patterns 252 in contact with the word lines 282 can be separated from the upper and lower charge storage patterns 252. That is, the charge storage patterns 252 may be vertically spaced apart from each other. Therefore, charges trapped in the charge storage patterns 252 can be prevented from diffusing into a direction perpendicular to the semiconductor substrate 200, and then disappeared.

In another embodiment of the present invention, the charge storage patterns 252 can be locally formed without using a sacrificial layer depicted in FIGS. 17 through 19. This will be described in detail referring to FIGS. 22 through 24.

Figure 22:
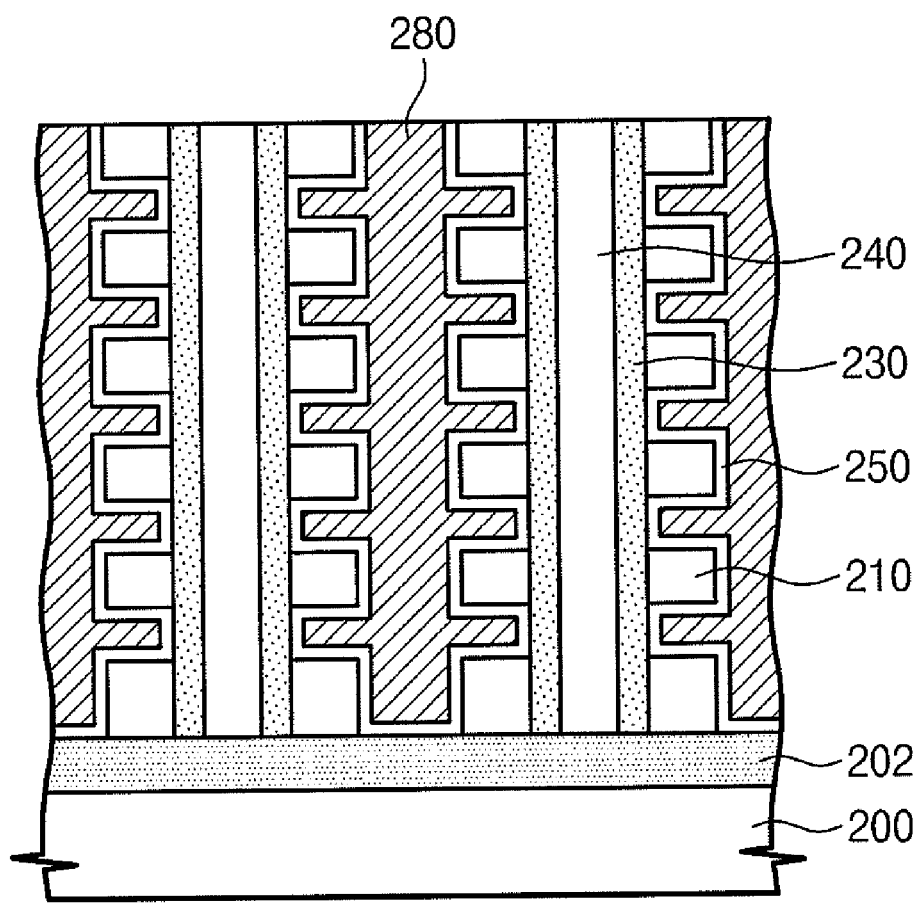
FIGS. 22, 23 and 24 are schematic cross-sectional views illustrating a method of manufacturing a nonvolatile memory device according to still another embodiment of the present invention.

Referring to FIG. 22 from FIG. 16, after conformally forming a charge storage layer 250 along a surface of the third trench 224 including the extended portions 226, a gate conductive layer 280 is buried in the third trench 224. The conductive layer 280 may be formed of a polysilicon layer or a metal layer. After burying the gate conductive layer 280, a top surface of the charge storage layer 250 and a top surface of the gate conductive layer 280 can be planarized.

Figure 23:
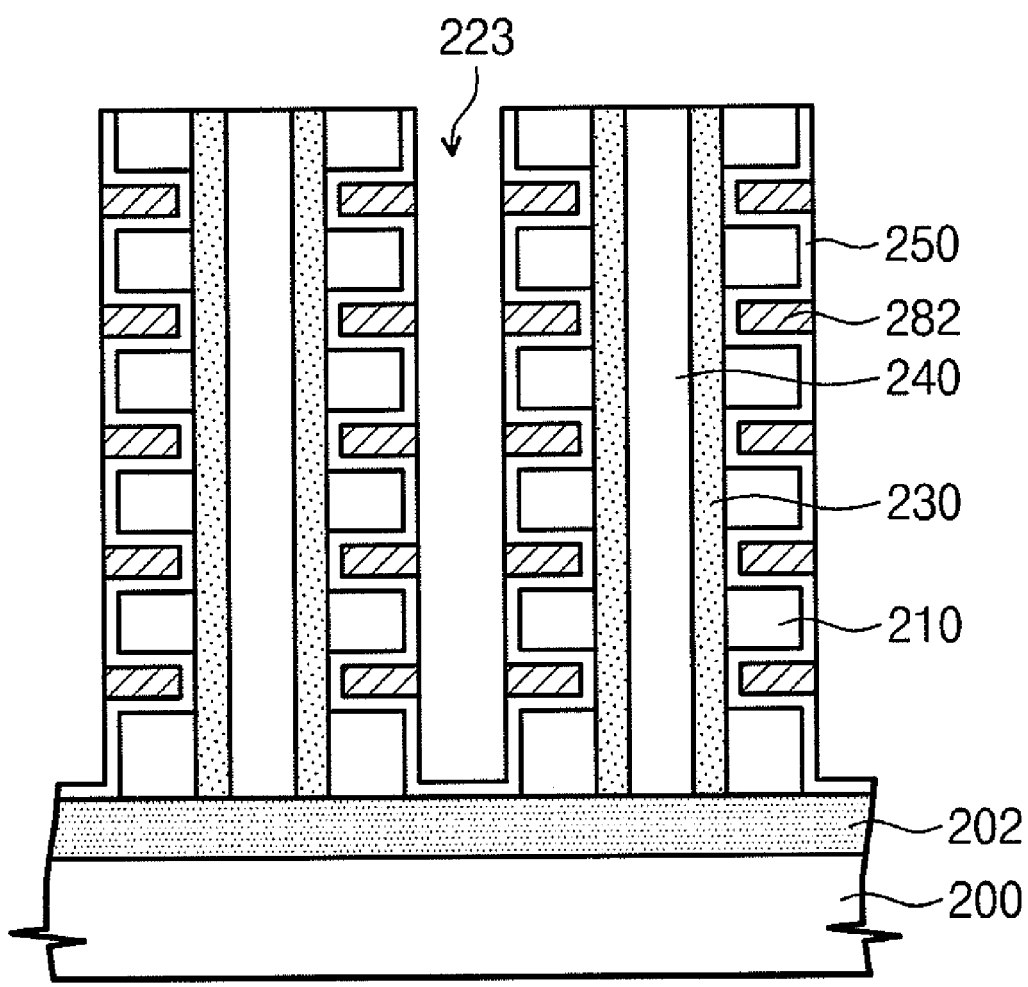

Referring to FIG. 23, the gate conductive layer 280 formed between the horizontally adjacent first insulating layers is removed to divide the gate conductive layer 280 into word lines 282. That is, the word lines 282 can be formed in the extended portions 222 respectively. The charge storage layer 250 on sidewalls of the first insulating layers 210 may be removed together the gate conductive layer 280 while the gate conductive layer 280 formed of a conductive material is anisotropically etched. That is, a trench 233 is formed again between the horizontally adjacent first insulating layers 210.

Figure 24:
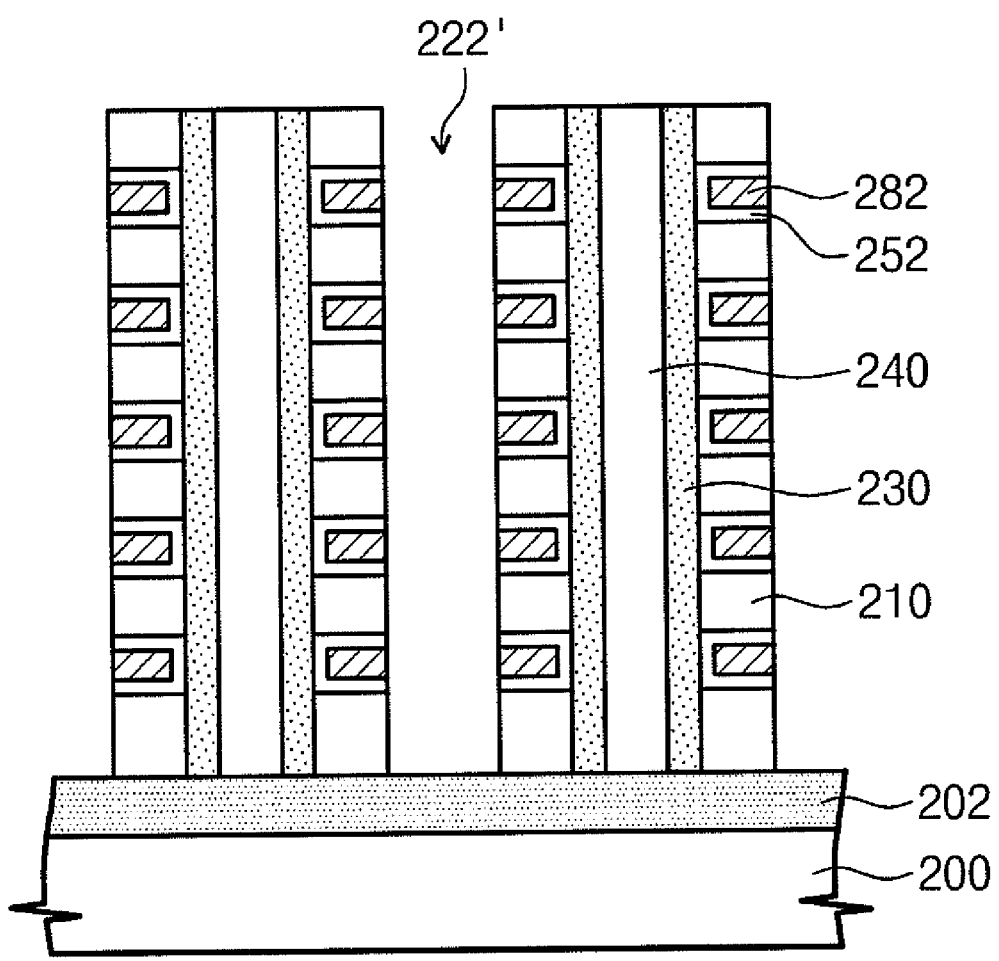

Referring to FIG. 24, after forming the word lines 282, the charge storage layer 250 formed on the sidewalls of the first insulating layers 210 are removed. Thus, charge storage layer patterns 252 covering one sidewall, a top surface and a bottom surface of the word line 282 can be locally formed in the extended portions 226.

The charge storage layer 250 can be divided into the charge storage layer patterns 252 by performing an anisotropical etching process or an isotropical etching process. When removing the charge storage layer 250, the charge storage layer 250 on the sidewalls of the first insulating layers 210 can be selectively etched using an etching gas or an etching solution having an etching selectivity with respect to the gate conductive layer. For example, when the charge storage layer 250 on the sidewalls of the first insulating layers 210 is removed, an etching solution such as HF, $O_3$/HF, phosphoric acid, sulfuric acid and LAL may be used. Also, an etching solution of a fluoride system, phosphoric acid or sulfuric acid may be sequentially used to remove the charge storage layer 250.

After forming word lines 282, when the charge storage layer 250 on the sidewalls of the first insulating layers 210 is removed, a gate conductive material remaining on a surface of the charge storage layer 250 may be removed together with the charge storage layer 250. Thus, since the charge storage layer patterns 252 are separated from each other, not only charges trapped in the charge storage patterns 252 can be prevented from diffusing into a direction perpendicular to the semiconductor substrate 200, and then disappeared but also an electric short between the word lines 282 due to conductive material remaining on the charge storage layer 250 can be prevented from occurring.

Figure 25:
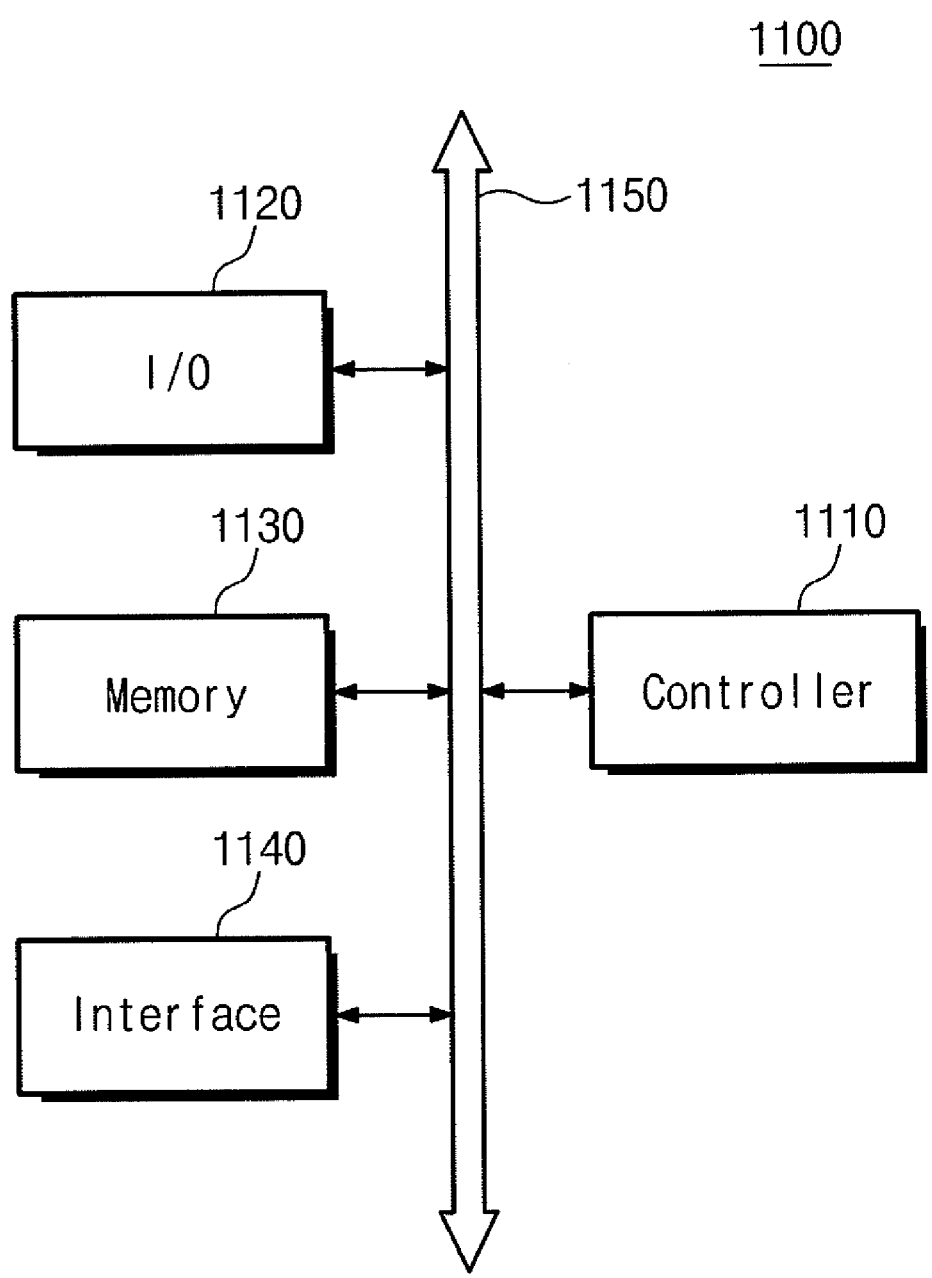
FIG. 25 is a schematic block diagram of a memory system including the nonvolatile memory device according to embodiments of the present invention.

FIG. 25 is a schematic view of a memory system including the nonvolatile memory device according to embodiments of the present invention.

Referring to FIG. 25, a memory system 1100 can be applied to PDA, a portable computer, a web tablet, a wireless phone, a mobile phone, a digital music player, a memory card or all the devices that can transmit and/or receive data under a wireless environment.

The memory system 1100 includes an input/output device such as a controller 1110, a keypad, a keyboard and a displayer, a memory 1130, an interface 1140 and a bus 1150. The memory 1130 and the interface 1140 communicate with each other through the bus 1150.

The controller 1110 includes at least one microprocessor, a digital signal processor, a microcontroller or other process devices. The memory 1130 is used to store an instruction executed by the controller 1110. The input/output device 1120 can receive data or signals from the outside of the system 1100 or transmit data or signals to the outside of the system 1100. For example, the input/output device 1120 may include a keyboard, a keypad or a display device.

The memory 1130 includes a nonvolatile memory device according to embodiments of the present invention. The memory 1130 may further include a different kind of memory, a volatile memory capable of randomly accessing and various kinds of memories.

The interface 1140 transmits data to a communicate network or receive data from a communicate network.

Figure 26:
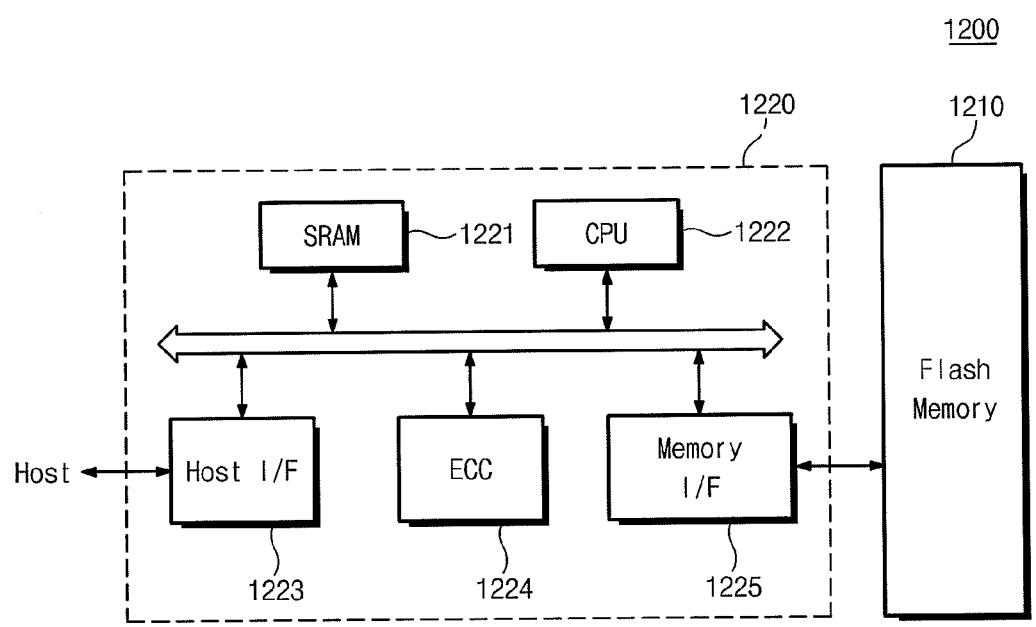
FIG. 26 is a schematic block diagram of an example of a memory card including a flash memory device according to an embodiment of the present invention.

FIG. 26 is a block diagram of an example of a memory card including a flash memory device according to an embodiment of the present invention.

Referring to FIG. 26, a memory card 1200 for supporting a storage capability of a huge amount of data is fitted with a flash memory device 1210 according to the present invention. The memory card 1200 according to the present invention includes a memory controller 1220 controlling data exchange between a host and the flash memory device 1210.

A SRAM 1221 is used as an operation memory of a processing unit 1222. A host interface includes data exchange protocols of the host connected to the memory card 1200. An error correction block 1224 detects and corrects errors included in data readout from the multi bit flash memory device 1210. A memory interface 1225 interfaces with the flash memory device 1210. The processing unit 1222 performs all the control operations for data exchange. Although not depicted in a drawing, those skilled in the art will readily appreciate that the memory card 1200 according to the present invention may further include a read only memory (ROM) storing code data for an interface with the host.

Figure 27:
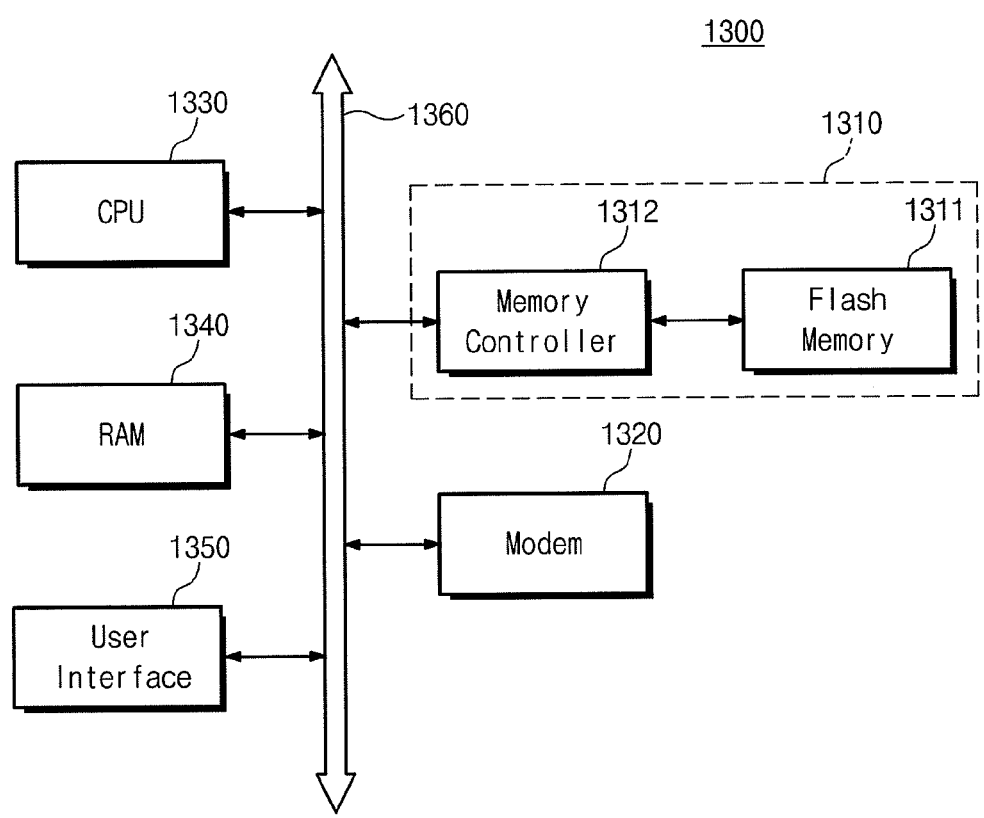
FIG. 27 is a schematic block diagram of a data processing system including a flash memory device according to the present invention.

FIG. 27 is a block diagram of a data processing system 1300 fitted with a flash memory device 1310 according to the present invention.

Referring to FIG. 27, the flash memory system 1310 of the present invention is built in a data processing system such as a mobile device or a desk top computer. A data processing system 1300 includes a flash memory system 1310, a modem 1320, a central processing unit 1330, a RAM 1340 and a user interface 1350 that are electrically connected to a system bus 1360. The flash memory system 1310 is substantially identical to the memory system or the flash memory system described above. The flash memory system 1310 stores data processed by the central process unit 1330 or data inputted from an external device. The flash memory system 1310 can be comprised of a solid state disk (SSD). In this case, huge amounts of data can stably be stored in the flash memory system 1310 of the data processing system 1300. As reliability increases, the flash memory system 1310 will provide a function of a high data exchange to the data processing system 1300 because the flash memory system 1310 can save resources required to correct errors. It will be understood by one of ordinary skill in the art that the data processing system 1300 according to the present invention can further include an application chipset, a camera image processor (CIS), an input/output device or the like.

Also, the flash memory device or the data processing system according to the present invention can be mounted with various types of packages. For example, the flash memory device or the data processing system according to the present invention can be mounted with various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

Although some embodiments of the present general inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. A nonvolatile memory device comprising:
    conductive layers that are stacked on a semiconductor substrate, an insulating layer being disposed between the conductive layers;
    active pillars comprising a body portion penetrating the conductive layers to be connected to the semiconductor substrate and a plurality of protrusions protruded toward sidewalls of the conductive layers from the body portion; and
    charge storage layer patterns formed between the sidewalls of the conductive layers and the protrusions of the active pillars.

2. The nonvolatile memory device of claim 1, wherein the protrusions are formed between vertically adjacent insulating layers and the charge storage layer patterns extend between the protrusions and the insulating layers.

3. A nonvolatile memory device comprising:
    conductive patterns three-dimensionally arranged on a semiconductor substrate, wherein the conductive patterns are stacked on the semiconductor substrate and insulating layer patterns are disposed between the conductive patterns;
    semiconductor patterns extending from the semiconductor substrate to pass between the conductive patterns; and
    a charge storage layer pattern disposed between the semiconductor pattern and the conductive pattern,
    wherein the charge storage layer pattern is separated from the charge storage layer pattern in contact with the different conductive pattern.

4. The nonvolatile memory device of claim 3, wherein the charge storage layer pattern extends in a top surface and a bottom surface of the conductive pattern.

* * * * *